(12) United States Patent
Kikuchi et al.

(10) Patent No.: US 7,253,864 B2
(45) Date of Patent: Aug. 7, 2007

(54) ACTIVE MATRIX DISPLAY DEVICE WITH ACTIVE ELEMENT INCLUDING A SEMICONDUCTOR FILM FORMED OF AN AGGREGATE OF SINGLE CRYSTALS EACH EXTENDING IN THE SAME DIRECTION

(75) Inventors: Hiroshi Kikuchi, Zushi (JP); Mikio Hongo, Yokohama (JP); Mutsuko Hatano, Kokubuji (JP); Makoto Ohkura, Fuchiyu (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 11/246,225

(22) Filed: Oct. 11, 2005

(65) Prior Publication Data

US 2006/0029426 A1    Feb. 9, 2006

Related U.S. Application Data

(63) Continuation of application No. 10/345,261, filed on Jan. 16, 2003, now Pat. No. 7,023,500.

(30) Foreign Application Priority Data

Jun. 5, 2002  (JP) ............................. 2002-164134
Sep. 20, 2002 (JP) ............................. 2002-274774

(51) Int. Cl.
  *G02F 1/136* (2006.01)
  *H01L 29/04* (2006.01)
  *H01L 21/268* (2006.01)

(52) U.S. Cl. ..................... 349/144; 349/43; 349/139; 349/141; 257/72

(58) Field of Classification Search ............... 349/48, 349/144
    See application file for complete search history.

(56) References Cited

U.S. PATENT DOCUMENTS 5,337,173 A * 8/1994 Atsumi et al. ............... 349/39
5,413,958 A   5/1995 Immahashi
5,432,122 A   7/1995 Chae (Continued)

FOREIGN PATENT DOCUMENTS

CN    1088002 A    6/1994

(Continued)

OTHER PUBLICATIONS

Excimer Laser-induced Temperature Field in Melting and Resolidification of Silicon Thin Films, Hatano et al., J. Appl. Phy., 2000 American Institute of Physics, vol. 87, pp. 36-43.

(Continued)

*Primary Examiner*—Andrew Schechter
(74) *Attorney, Agent, or Firm*—Antonelli, Terry, Stout & Kraus, LLP.

(57) ABSTRACT

A laser beam is selectively directed to an amorphous silicon film of a pixel portion on an active-matrix substrate of a display device to modify the amorphous silicon film into a polysilicon film. Pixel circuits such as thin film transistors are formed on the modified polysilicon film. Thus, it is possible to realize remarkably economically the display device provided with the active-matrix substrate having the high performance thin film transistor circuits.

11 Claims, 20 Drawing Sheets

U.S. PATENT DOCUMENTS

| | | |
|---|---|---|
| 5,648,662 A | 7/1997 | Zhang et al. |
| 5,729,308 A * | 3/1998 | Yamazaki et al. ............. 349/39 |
| 5,929,958 A * | 7/1999 | Ohta et al. .................. 349/141 |
| 6,136,632 A * | 10/2000 | Higashi ...................... 438/166 |
| 6,204,519 B1 | 3/2001 | Yamazai et al. |
| 6,248,606 B1 | 6/2001 | Ino et al. |
| 6,297,862 B1 | 10/2001 | Murade |
| 6,323,918 B1 | 11/2001 | Yoshioka et al. |
| 6,714,274 B2 * | 3/2004 | Aoki et al. .................. 349/139 |

FOREIGN PATENT DOCUMENTS

| | | |
|---|---|---|
| JP | 07-106599 | 4/1995 |
| JP | 08-129189 | 5/1996 |

OTHER PUBLICATIONS

"Effect of Excimer Laser Annealing on the Structural and Electrical Properties of Polycrystalline Silicon Thin-Film Transistor," C.T. Angelis et al., J. Appl. Phy., vol. 86, pp. 4600-4606, 1999.

"Lateral Grain Growth of Poly-Si Films with a Specific Orientation by an Excimer Laser Annealing Method," H. Kuriyama et al., J. Appl. Phy., vol. 32, pp. 6190-6195, 1993.

"Correlation Between Power Density Fluctuation and Grain Size Distribution of Laser Annealed Poly-Crystalline Silicon," K. Suzuki et al., SPIE Conference, vol. 3618, pp. 310-319, Jan. 25-27, 1999.

* cited by examiner

ACTIVE MATRIX DISPLAY DEVICE WITH ACTIVE ELEMENT INCLUDING A SEMICONDUCTOR FILM FORMED OF AN AGGREGATE OF SINGLE CRYSTALS EACH EXTENDING IN THE SAME DIRECTION

CROSS-REFERENCE TO RELATED APPLICATION

This application is a continuation of U.S. application Ser. No. 10/345,261, filed Jan. 16, 2003, now U.S. Pat. No. 7,023,500 the entire contents of which are herein incorporated by reference.

BACKGROUND OF THE INVENTION

The present invention relates to a display device and, more particularly, to an active-matrix type display device wherein an active element includes a semiconductor film which is formed by modifying properties of a semiconductor film formed on an insulating substrate with laser light and a method for manufacturing the display device. Hereinafter, the display device may sometimes be referred to as "display apparatus" or simply as "display".

The active-matrix type display device (also referred to as "display device with an active matrix type driving system" or "display apparatus"), which includes an active element such as a thin film transistor or the like as a driving element for each of pixels arranged in a matrix, has widely been used. As is known to those skilled in the art, many kinds of such active-matrix type display device can display high quality images owing to a plurality of pixel circuits arranged on a substrate, each of the pixel circuits being composed of the active element such as the thin film transistor formed by using a silicon film as the semiconductor film. Hereinafter, the thin film transistor, which is a typical example of the active element, will be described.

It has been difficult to form a high-speed and high-performance circuit with the use of the thin film transistor formed by using an amorphous silicon semiconductor film (hereinafter also referred to as "silicon semiconductor film" or "silicon film"), which has typically been used as the semiconductor film, due to limitations of properties, such as a mobility, of the thin film transistor. In order to realize a high properties, such as a mobility, of the thin film transistor. In order to realize a high mobility thin film transistor which is required for providing a better image quality, it is effective to form the thin film transistor by using a crystallized polysilicon film prepared by modifying (crystallizing) the amorphous silicon film in advance.

The modification (crystallization) of the amorphous silicon film into the polysilicon film and improvements in crystallinity have been achieved by excimer laser light (also referred to as "laser beam" or simply as "laser light") irradiation. Such crystallization method is described in detail in, for example, non-patent documents 1 to 3 and so forth.

The modification of amorphous silicon film through the crystallization employing the excimer laser light irradiation will be described with reference to FIGS. 26A and 26B. FIGS. 26A and 26B illustrate an excimer pulsed laser light scanning which is the most popular crystallization method. A structure of a glass substrate, on which a semiconductor layer to be irradiated with the laser light is formed, is shown in FIG. 26A, and a state of the modification achieved by the laser light irradiation is shown in FIG. 26B. The substrate is typically formed from glass or ceramic, and an example wherein the glass substrate is used will be described below.

An amorphous silicon film 302 which is deposited on the glass substrate 301 with an undercoating layer (SiN layer or the like; not shown) interposed therebetween is irradiated with a linear excimer laser beam 303 having a width of several millimeters to several hundreds of millimeters. Scanning is then performed wherein the irradiation positions are changed by 1 to several pulses along one direction (x direction) indicated by an arrow, to thereby modify the amorphous silicon film 302 covering the whole substrate 301 into a polysilicon film 304. The polysilicon film 304 modified by the above-described method is subjected to various processing such as etching, formation of wiring, and ion implantation to obtain an active-matrix substrate on which thin film transistor circuits for driving is formed for each of pixel portions. The thus obtained substrate is used for manufacturing an active-matrix type display such as a liquid crystal display, and an organic EL display.

FIG. 27A is a plan view showing a part of the laser light irradiation portion shown in FIG. 26B, and FIG. 27B is a plan view showing a configuration of a main part of a thin film transistor portion of FIG. 26B. As shown in FIG. 27A, many crystallized silicon grains each having a grain size of about 0.05 µm to 0.5 µm grow uniformly on a surface of the laser light irradiation portion. Each of boundaries of the silicon grains (i.e., silicon crystals) is closed. The portion enclosed in a rectangle in FIG. 27A is a transistor portion TRA which is to be used as the semiconductor film of each of the thin film transistors. The above-described crystallization represents the conventional silicon film modification, and it should be emphasized that the modification of the present invention is different from the conventional technique.

In order to form a pixel circuit by using the modified silicon film 304, an MIS transistor is manufactured by: removing an unnecessary portion, which is a portion other than that to be used as the transistor TRA shown in FIG. 27A, so as to use a portion of the crystallized silicon as the transistor portion as shown in FIG. 27B; forming an island shaped silicon film; and then arranging a gate insulating film (not shown), a gate electrode (GT), a source electrode (SD1), and a drain electrode SD2 on the thus obtained island PSI. This transistor formation technique is known to those skilled in the art. Since the modification operation has been performed on all parts of the pixel portion in the conventional technique, the conventional technique has been insufficient in efficiency of the modification.

The following represents background literature.

Non-patent Literature 1

T. C. Angelis et al.; Effect of Excimer Laser Annealing on the Structural and Electrical Properties of Polycrystalline Silicon Thin-Film Transistor, J. Appl. Phy., Vol. 86, pp 4600-4606, 1999.

Non-patent Literature 2

H. Kuriyama et al.; Lateral Grain Growth of Poly-Si Films with a Specific Orientation by an Excimer Laser Annealing Method, Jpn. J. Appl. Phy., Vol. 32, pp 6190-6195, 1993.

Non-patent Literature 3

K. Suzuki et al.; Correlation between Power Density Fluctuation and Grain Size Distribution of Laser Annealed Poly-Crystalline Silicon, SPIE Conference, Vol. 3618, pp. 310-319, 1999.

SUMMARY OF THE INVENTION

Although the above-described conventional technique has an advantage of manufacturing the active-matrix substrate having the high performance thin film transistors by forming the modified silicon film on the substrate, cost for the silicon film modification thereof is considerably high; therefore, the advantage has not been fully exploited. The problem has developed from the necessity of expensive excimer laser device and because much time has been consumed for the silicon film modification due to insufficiencies in strength and pulse width of excimer laser pulse.

The problem becomes prominent if a substrate fabricated by multiple patterning is used for manufacturing a large size display device with the aim of providing an inexpensive display device. Since throughput capability has still remained insufficient even after installing very expensive equipment for modifying the silicon film of the large size substrate, the problem has hardly been ignorable. Therefore, there has been a strong demand for a novel technique which realizes a high speed and highly efficient silicon film modification for the large size substrate using low-cost equipment.

In view of the above-described problem, a first object of the present invention is to provide economically a display device which includes an active-matrix substrate having a high performance thin film transistor circuit for each of pixels arranged in a matrix. A second object of the present invention is to provide a specific manufacturing technique which solves the above-described problem. It should be noted that the present invention is not limited to the modification of a semiconductor film formed on a glass substrate, etc. of a display device but is applicable to a modification of a semiconductor film formed on another type of substrate such as a silicon wafer and so forth.

As a solution to the problem, a silicon film of a pixel portion is selectively irradiated with a laser beam (hereinafter also referred to as "laser light"), and pixel circuits are formed on the modified silicon film of the pixel portion in the present invention. The pixel circuits may typically be thin film transistors. Preferably, in the manufacturing method of the active-matrix type display device according to the present invention, a silicon film of a pixel portion may selectively be irradiated with a laser beam, the selective laser beam irradiation being performed by employing reciprocation operation, to form pixel circuits on the modified silicon film of the pixel portion. More preferably, pixel portions may collectively be arranged so that silicon films of the collected pixel portions are irradiated with a laser beam, the selective laser beam irradiation being performed by employing reciprocation operation, to form pixel circuits on the modified silicon films of the pixel portions.

The silicon film modification of the present invention differs from the conventional silicon film modification, and the difference will be explained below.

In the silicon film modification of the present invention, the silicon film crystallized by the modification becomes an aggregate of single crystals having a width of 0.1 μm to 10 μm and a length of 1 μm to 100 μm, thereby ensuring excellent carrier mobility. The carrier mobility as represented by electron mobility is about 300 $cm^2/V \cdot s$ or more, preferably 500 $cm^2/V \cdot s$ or more.

On the other hand, in the conventional silicon film modification using the excimer laser, many crystallized silicon grains each having a grain size of 0.05 μm to 0.5 μm grow uniformly on the laser irradiation portion, thereby giving a silicon film having electron mobility of about 100 $cm^2/V \cdot s$ or less, or about 50 $cm^2/V \cdot s$ on average. The silicon film obtained by the conventional silicon film modification technique leads to an improved performance as compared with the amorphous silicon film which has the electron mobility of 1 $cm^2/V \cdot s$ or less. It is emphasized, however, a still superior modification is employed in the present invention.

The silicon film of the pixel portion on the active-matrix substrate which is provided in the display device according to the present invention may preferably be an amorphous silicon film (non-crystalline silicon film) which is formed by a CVD method and the modified silicon film of the pixel portion may preferably be a polysilicon film (polycrystalline silicon film). However, the present invention is not limited to the above-mentioned silicon films; the silicon film of the pixel portion may be a polysilicon film obtained by modifying an amorphous silicon film, and the modified silicon film of the pixel portion may be a further modified polysilicon film. As used herein, "modified polysilicon film" means a silicon film obtained by crystallizing non-crystalline silicon, wherein each of grain boundaries of the crystals is closed basically. As used herein, "further modified polysilicon film" means a polysilicon film having a crystal structure wherein the grain boundaries are changed to be continuous in a predetermined direction.

Further, according to the present invention, it is possible to use a polysilicon film formed by a sputtering method as the silicon film of the pixel portion and a further modified polysilicon film as the modified silicon film of the pixel portion. Moreover, the present invention enables combined use of a polysilicon film formed by a CVD method as the silicon film of the pixel portion and a further modified polysilicon film as the modified silicon film of the pixel portion.

In the present invention, the silicon film of the pixel portions on the substrate is selectively irradiated with the laser beam; therefore, the invention is characterized in that laser irradiation portions, i.e., modified silicon portions, are formed in a stripe shape on the substrate surface. By positively employing the stripe shape, the necessity of application of the laser beam irradiation on the portion other than the pixel portions, which is to be removed by the etching in the thin film transistor formation process, is eliminated, thereby reducing the number of unnecessary processes by a large scale The laser to be used in the present invention may preferably be a continuous oscillation solid state laser having an oscillation wavelength of 400 to 2,000 nm. The continuous oscillation laser light may preferably have a wavelength to be absorbed by the non-crystalline or polycrystalline silicon film which is the object of annealing, i.e., a wavelength in the ultraviolet wavelength region or the visible wavelength region; more specifically, Ar laser or Kr laser and their second harmonic, a second harmonic and a third harmonic of each of Nd:YAG laser, Nd:YVO$_4$ laser, and Nd:YLF laser, etc. However, considering output power and stability, a second harmonic (wavelength: 532 nm) of LD (laser diode)-excited Nd:YAG laser or a second harmonic (wavelength: 532 nm) of Nd:YVO$_4$ laser may be the most preferable laser light. The upper limit and lower limit of the laser wavelength are decided depending on the balance between the efficiency of light absorption by the silicon film and details such as price and stability of a laser light source to be used.

The solid state laser to be used in the present invention is characterized in that it supplies the laser light to be absorbed by the silicon film and imposes less financial burdens such as gas exchange operation which is specific to gas lasers, deterioration of a firing unit; therefore, the solid state laser light is preferred as the means for economically modifying the silicon film. However, the present invention does not positively exclude excimer laser having a wavelength of 150 to 400 nm.

In the present invention, the laser light may preferably be adjusted optically to ensure uniform spatial distributions in intensity and condensed by a lens system for the irradiation. Further, in order to adjust a crystallinity of the modified silicon film, the continuous oscillation laser light may preferably be formed optically and pulsed for the irradiation. A pulse width of the laser may preferably be selected from the range of 100 ns to 1 ms.

In the present invention, an irradiation width in the case of emitting the laser light to form the stripe shape on the substrate may preferably be from 20 µm to 1,000 µm. The width is decided in view of economies to be accomplished by a width of a portion required for the pixel circuits and a proportion of the portion width to a pixel pitch. A length of the irradiation portion is decided in view of the size of the substrate and the size of the pixel portions. In the present invention, it is also possible to perform the laser irradiation intermittently in synchronization with stage scanning, and the effect of the invention is not diminished in this case.

The present invention is characterized in that the laser irradiation is applied by scanning the substrate at a scanning speed of 1 to 1,000 mm/s. The lower limit of the scanning speed is decided in view of time required for scanning a predetermined portion of the substrate and financial burdens, while the upper limit hinges upon ability of equipment required for the scanning.

The present invention is characterized in that the laser irradiation is applied by scanning the substrate with a laser beam which is formed by condensing the laser light by the use of an optical system. The optical system which condenses single light into a single beam may be used for the laser irradiation. However, if the single laser light is divided into a plurality of laser beams, efficiency of the laser light irradiation is remarkably improved since a plurality of array of pixel portions can be simultaneously scanned with the laser beams. Therefore, the divided laser light irradiation is a preferred mode of the present invention. Such mode of laser light scanning is particularly preferable in the case of processing a large size substrate in a short time.

If the laser light irradiation is performed by using a plurality of laser oscillators operated parallelly, efficiency of the laser irradiation is remarkably improved. This mode is also particularly preferable in the case of processing a large size substrate in a short time.

Further, in the present invention, it is possible to form not only the pixel circuit portion but also a peripheral circuit portion by the selective laser light scanning. The choice of irradiating the portion on which peripheral circuits are formed with the laser light is recommended if the properties of the thin film transistors formed on the pixel circuit portion satisfy properties required for the peripheral circuits. Such choice reduces the number of driving circuit chips (LSI driver, driver IC) required for driving the display by a large scale, thereby offering an enormous economical effect.

In the present invention, the circuit obtained by using the modified silicon film is not limited to a typical top gate type thin film transistor circuit, and a bottom gate type thin film transistor circuit is also obtainable from the modified silicon film. If a single channel circuit consisting of an N-channel MIS or a P-channel MIS is desired, the bottom gate type may be in some cases preferred in view of simplification of manufacturing process. Since the silicon film which is formed on an insulating film formed on a gate wiring is modified through the application of laser irradiation in such a case, metal with a high melting point may preferably be used as a gate wiring material. Using a metal with a high melting point containing tungsten (W) or molybdenum (Mo) as a main ingredient of the gate wiring material is one of the characteristics of the present invention.

An active-matrix substrate in which pixel circuits are arranged with a pitch equal to the pitch of the pixels is obtained by employing the above-described method of the present invention and as a result of the large-scale improvement in efficiency of the laser light irradiation.

Moreover, if the pixel circuit arrangement is contrived, the efficiency of the laser light irradiation is further improved to a remarkable degree as a surprising effect. In the improved arrangement of pixel circuits, circuit portions of two arrays of pixels arranged at regular intervals are collectively disposed on the center portion of the two arrays, and pixel portions on which the circuit portions are collectively disposed are selectively irradiated with the laser light to modify the silicon film, thereby enhancing the laser light irradiation to be twice as efficient as that performed without the contrivance. The present invention is characterized by the arrangement of pixel circuits with a pitch which is twice that of pixels.

By the use of the active-matrix substrate having the semiconductor structure of the pixel circuits or the peripheral circuits of the present invention, a liquid crystal display device which is inexpensive and excellent in image quality is provided. Further, by the use of the active-matrix substrate of the present invention, an organic EL display device which is inexpensive and excellent in image quality can be provided. The present invention goes beyond the applicability to the liquid crystal display device and the organic EL display device, and it is applicable to other kinds of active-matrix type display devices wherein pixel circuits or peripheral circuits have a semiconductor structure similar to the above-described one.

BRIEF DESCRIPTION OF THE DRAWINGS

These and other features, objects and advantages of the present invention will become more apparent from the following description when taken in conjunction with the accompanying drawings, wherein.

DETAILED DESCRIPTION OF PREFERRED EMBODIMENTS

Hereinafter, embodiments of the present invention will be described in detail with reference to the accompanying drawings.

A general description of the present invention will firstly be made with reference to FIGS. 1A to 7. Some parts of the general description can also be found in the descriptions of the embodiments which is given later in this specification. First, a SiN film 102 and a SiO film 103 are formed on a substrate (hereinafter referred to as "glass substrate") 101 by CVD or the like as thin barrier films, and then an amorphous silicon film 104 having a thickness of about 50 nm is deposited on the barrier film by CVD (see FIG. 1A). The above layer structure and thickness of the barrier films as well as the thickness of the silicon film are given by way of example, and are not to be construed as being limited thereto. After that, only a pixel portion is irradiated with laser light employing the laser irradiation method of the present invention so as to modify a portion on which pixel circuits are to be formed (see FIG. 1B).

Figure 2:
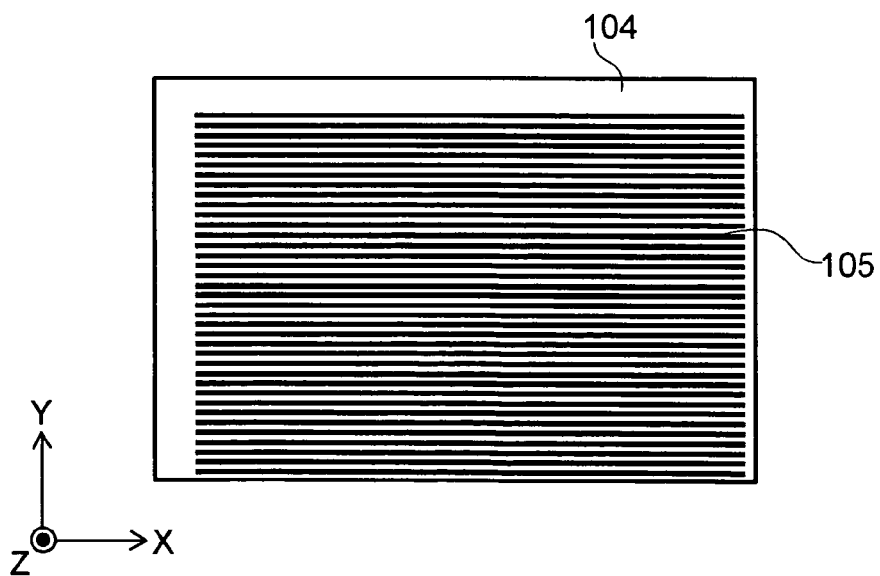
FIG. 2 is a plan view schematically showing a laser light irradiation pattern for modifying the silicon film of the active matrix substrate of the display device according to the first embodiment.
Figure 3:
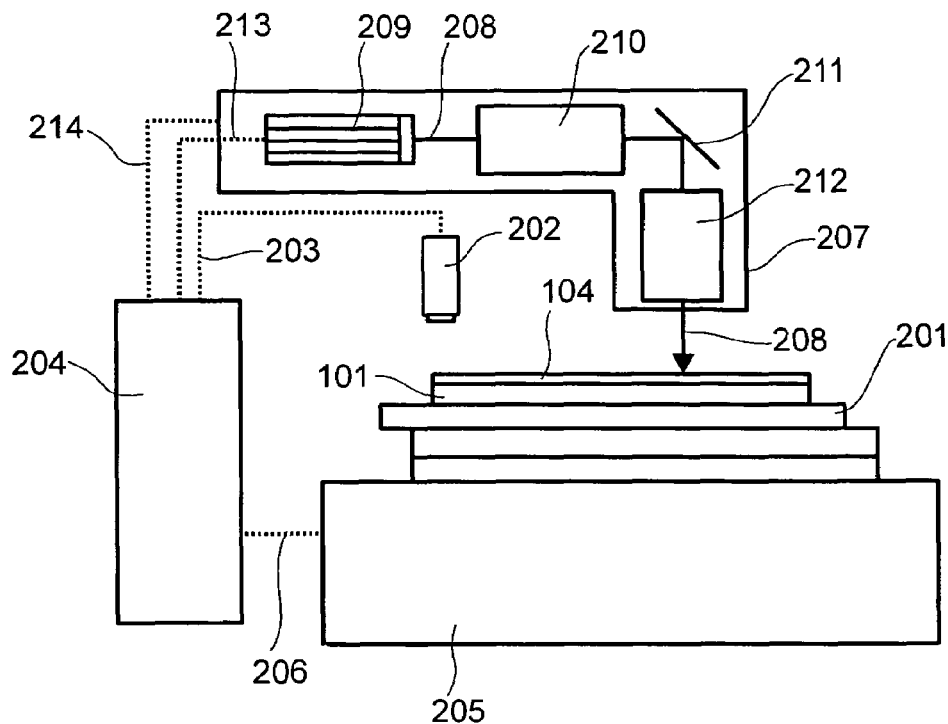
FIG. 3 is a block diagram schematically showing a laser light irradiation device for modifying the silicon film of the active matrix substrate of the display device according to the first embodiment.

A plan view of the irradiation portions on the substrate is schematically shown in FIG. 2. As shown in FIG. 2, the present invention enables formation of silicon films 105 which are aligned in parallel with each other along a predetermined direction in a stripe shape. An example of a device to be used for implementing the laser light irradiation is shown in FIG. 3. The glass substrate 101 on which the amorphous silicon film 104 is deposited is placed on a driving stage 201 which moves in XY directions, and then the glass substrate is positioned at a proper place by the use of a reference position measurement camera 202. A reference position measurement signal 203 from the reference position measurement camera 202 is inputted to a controller 204.

Driving equipment 205 performs fine control of an irradiation spot based on a control signal 206 inputted from the controller 204 to move the driving stage 201 at a predetermined speed, so that the glass substrate 101 is scanned in one direction. In synchronization with the scanning, laser light 208 from irradiation equipment 207 is directed to the silicon film 104, so that the silicon film 104 is modified into the polysilicon film 105.

Figure 4:
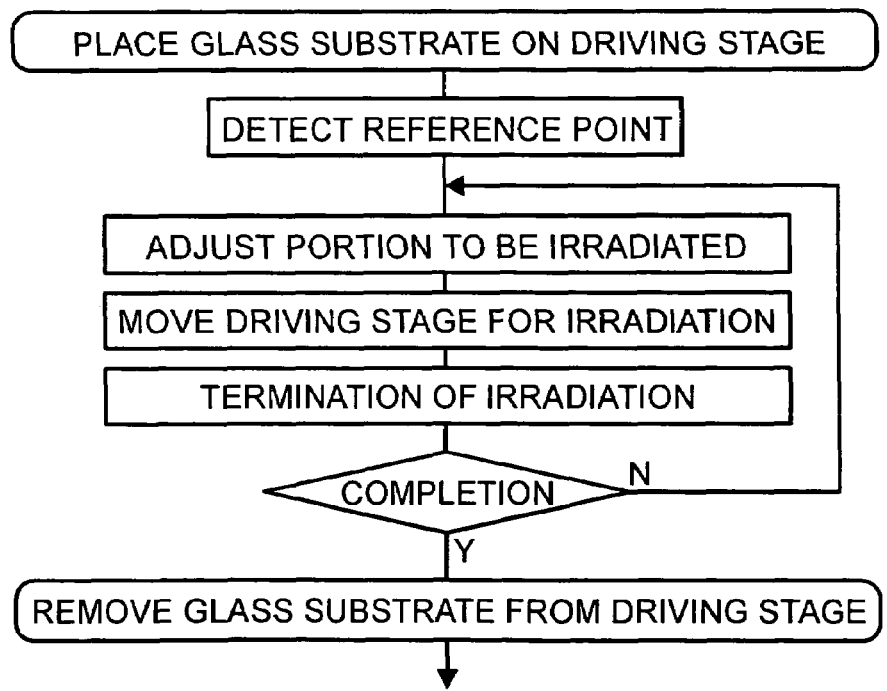
FIG. 4 is a flowchart showing the steps of laser light irradiation operation for modifying the silicon film of the active matrix substrate of the display device according to the first embodiment.

A desired irradiation beam can be formed by arranging a laser light source 209, an optical system 210 such as a homogenizer, a reflection mirror 211, and a condenser lens system 212 of the irradiation equipment 207. An irradiation period, irradiation intensity and so forth of the laser light are adjusted by way of an ON-OFF signal 213 and a control signal 214 from the controller 204. Such irradiation sequence is shown in the flowchart of FIG. 4. It should be emphasized that the present invention enables a speed of the irradiation to be increased by a large scale as a result of performing a plurality of sets of the above-described scanning techniques by way of parallel operation of a plurality of units of the irradiation equipment 207.

In the present invention, it is preferred to employ a reciprocation irradiation method wherein the glass substrate 101 is irradiated with the laser light while being scanned in one direction (x direction) as described above and then a relative position of the irradiation equipment 207 and the glass substrate 101 is slightly shifted in another direction (y direction) which is perpendicular to the x direction to irradiate the glass substrate 101 with the laser light while scanning the glass substrate 101 in a vertically reverse direction. Since the reciprocation operation enables effective use of the stage-scanning period, it achieves an effect of reducing the time required for the irradiation of all the pixel portions on the glass substrate 101 by a large scale.

Figure 5A:
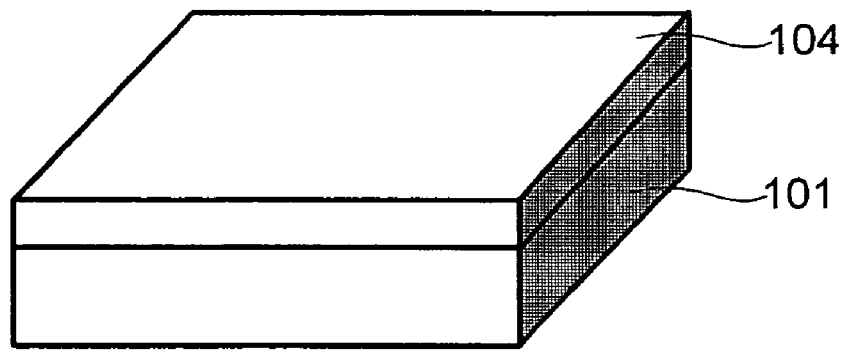
FIGS. 5A and 5B are stereograms for illustrating the laser light irradiation to be used for modifying the silicon film of the active matrix substrate of the display device according to the first embodiment.
Figure 5B:
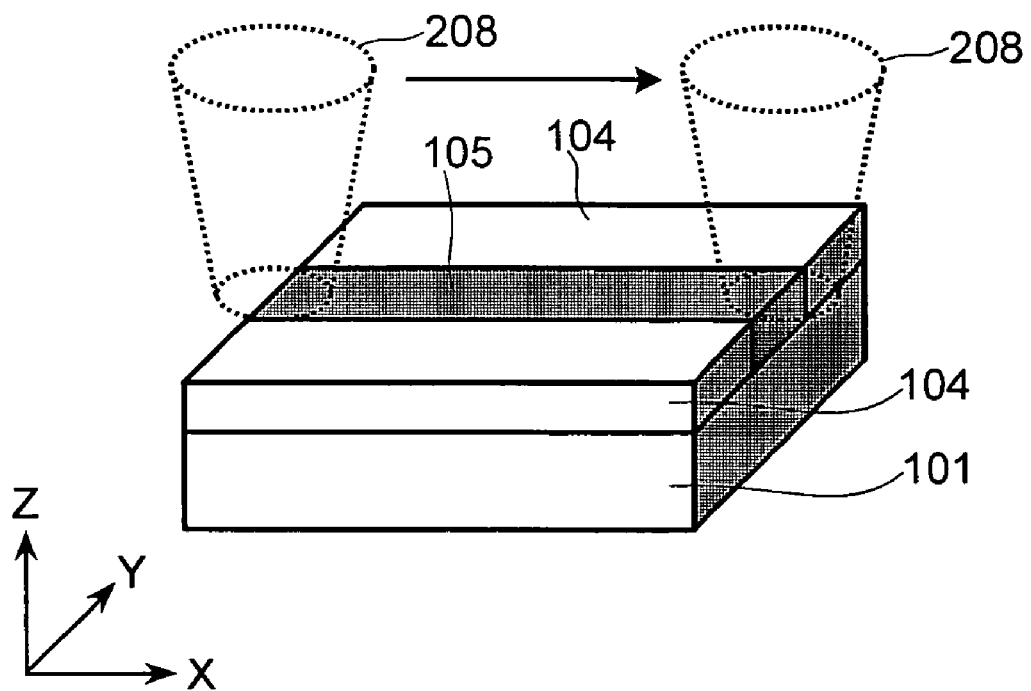
Figure 6A:
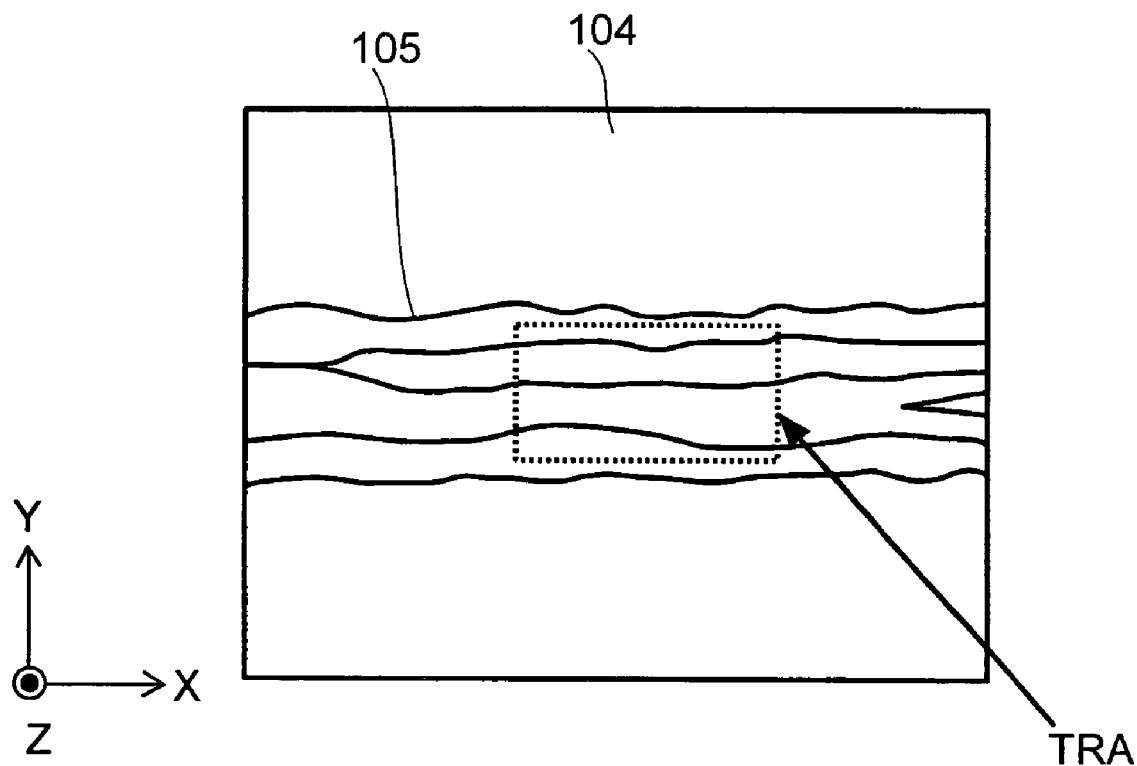
FIG. 6A is a diagram schematically showing a configuration of a laser light irradiation portion.
Figure 6B:
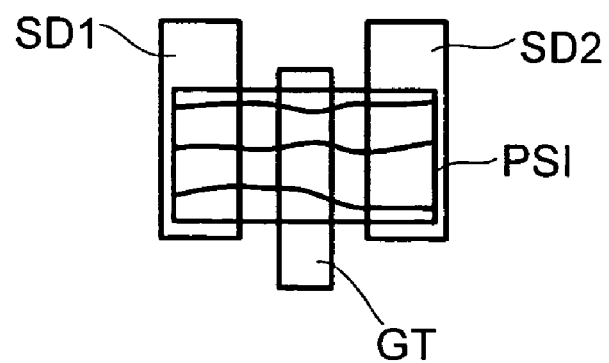
FIG. 6B is a diagram schematically showing a configuration of a thin film transistor.

A more detailed illustration of the laser light irradiation of the present invention is shown in FIGS. 5A and 5B. In the present invention, the amorphous silicon film 104 formed on an undercoating layer (not shown) of the glass substrate 101 is irradiated with the laser light 208 which is condensed as shown in FIG. 5B with the irradiation portion being scanned in the x direction. As a result, the modified silicon film 105 is formed narrowly zonally (in a stripe form). FIGS. 6A and 6B are diagrams schematically showing structures of the laser light irradiation portion and the thin film transistor; FIG. 6A is a plan view showing the laser irradiation portion; and FIG. 6B is a plan view showing an example of the structure of the thin film transistor.

As shown in FIG. 6A, the amorphous silicon film 104 on the glass substrate 101 is irradiated with the laser light by scanning, so that crystallized silicon grows on the laser light irradiation portion along the laser light scanning direction (x direction in the drawing) in a striped form. The transistor portion TRA, which is indicated by dotted lines, is formed on the growth area of the crystallized silicon, i.e., the area of polysilicon film.

The above-described crystallization represents the silicon film modification of the present invention, and the crystallized portion is the stripe-shaped crystal having a width of 0.1 to 10 μm and a length of 1 to 100 μm, which is an aggregate of single crystals. Efficiency of the modification is largely improved by forming pixel circuits using the modified silicon film 105. Specifically, in order to use a portion of the silicon film as the transistor portion TRA shown in FIG. 6A, an unnecessary portion of the crystallized silicon film is removed by etching to form an island PSI of the silicon film shown in FIG. 6B, and then a gate insulating film (not shown), a gate electrode GT, a source electrode SD1, and a drain electrode SD2 are formed on the island PSI, to thereby obtain an MIS transistor. Such transistor formation technique is known to those skilled in the art. A shape of the laser light irradiation spot on the glass substrate is not limited to the circular form, and the shape may be changed to be elliptical, square or rectangular. Such shapes are within the limit of adjustability of the optical system.

Figure 1A:
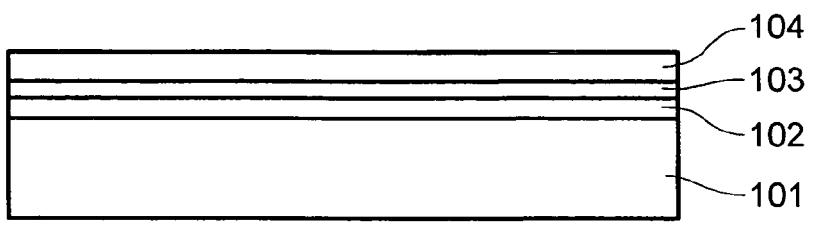
FIGS. 1A to 1C are sectional views schematically showing the procedures for forming an active matrix substrate of a display device according to a first embodiment of the present invention.
Figure 1B:
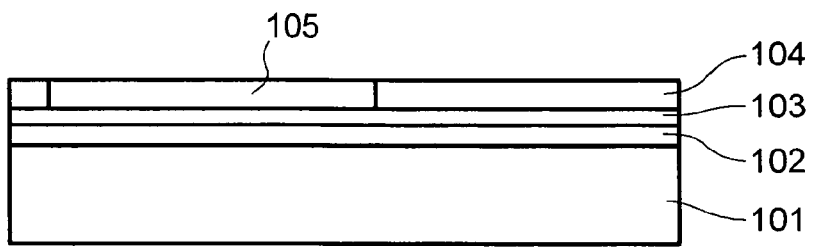
Figure 1C:
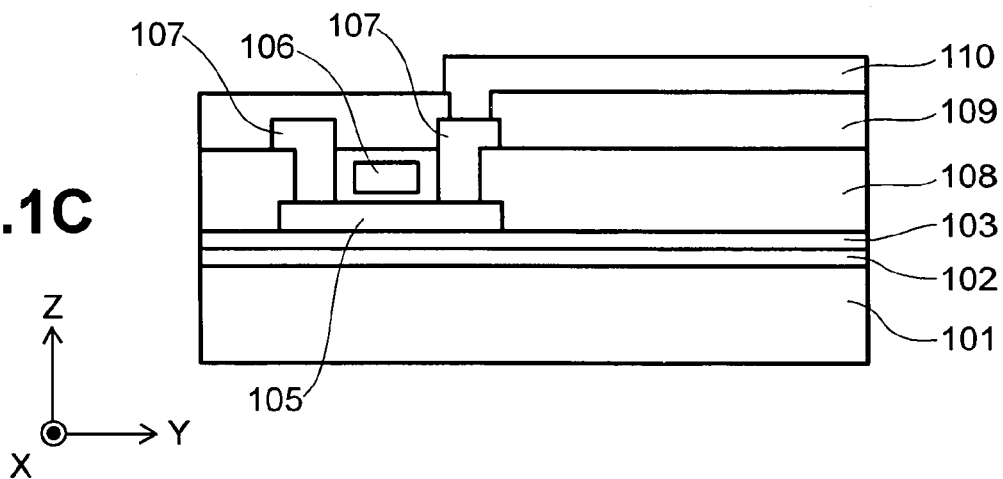

In the present invention, the modified silicon film 105 is subjected to the etching to obtain a predetermined circuit as shown in FIG. 1C, and then a gate insulating film (not shown), a gate electrode (or gate wiring) 106, source/drain wiring 107, an interlayer insulating film 108, a passivation film 109, and a transparent film 110 which is to be used as an pixel electrode are formed thereon in this order. Thus, an active-matrix substrate on which a transistor circuit is arranged for each of pixels using the modified silicon film 105 is obtained. Details of techniques relating to the process of forming the transistor circuit and electrodes are known to those skilled in the art. Further, it is well known that ion implantation, activation annealing and so forth are added to the formation process.

Figure 7:
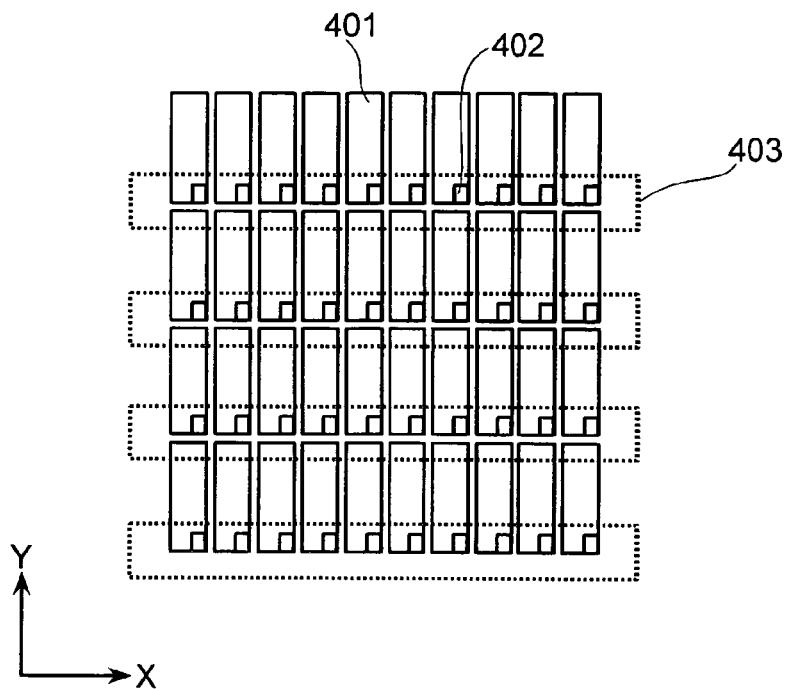
FIG. 7 is a plan view showing the relationship between a pixel portion and a laser light irradiation portion of the active matrix substrate according to the first embodiment.

FIG. 7 is a plan view illustrating the relationship between the pixel portion and the laser light irradiation portion of the active-matrix substrate. Dimensions in FIG. 7 do not accurately correspond to actual ones; however, the relationship among a pixel 401, a pixel circuit portion 402, and a laser irradiation portion 403 is shown in the drawing. From FIG. 7, it is apparent that the area of the laser irradiation portion 403 is about ⅕ to ½ that of the whole pixel portion.

Hereinafter, modes for carrying out the present invention will be described in detail with reference to drawings relevant to the embodiments.

First Embodiment

Figure 8:
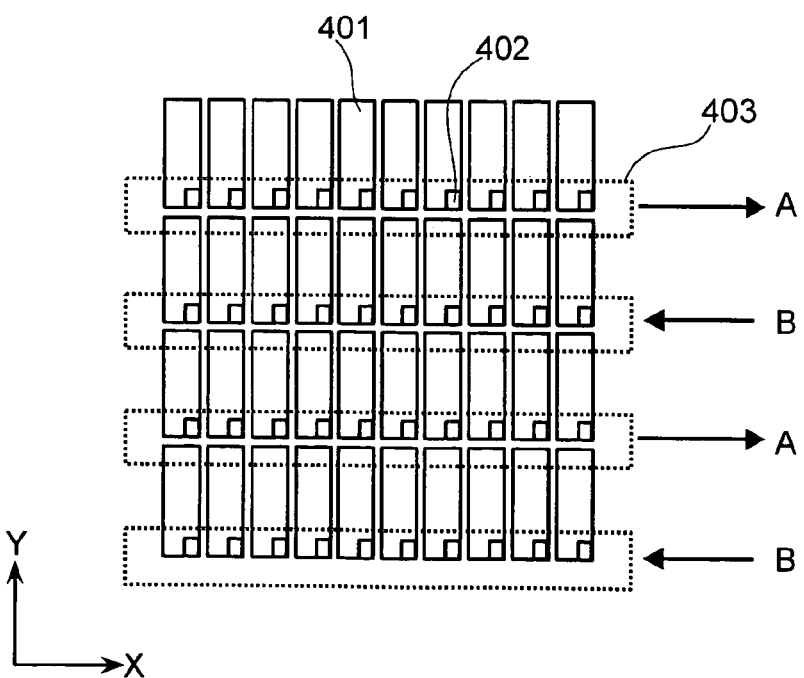
FIG. 8 is a plan view showing the relationship between a pixel portion and a laser light irradiation portion of the active matrix substrate according to the first embodiment.

A first embodiment will hereinafter described with reference to FIGS. 1A to 5 and 8. FIGS. 1A to 1C are sectional views schematically showing the steps of forming an active matrix substrate of a display device according to the present embodiment; FIG. 2 is a plan view schematically showing a laser light irradiation pattern for modifying a silicon film of the active matrix substrate of the display device according to the present embodiment; FIG. 3 is a block diagram schematically showing a laser light irradiation device for modifying the silicon film of the active matrix substrate of the display device according to the present embodiment; FIG. 4 is a flowchart showing a process of laser light irradiation operation for modifying the silicon film of the active matrix substrate of the display device according to the present embodiment; FIGS. 5A and 5B are stereograms showing the laser light irradiation to be used for modifying the silicon film of the active matrix substrate of the display device according to the present embodiment; and FIG. 8 is a plan view showing a relationship between a pixel portion and the laser light irradiation portion of the active matrix substrate of the display device according to the present embodiment.

As shown in FIG. 1A, a heat-resistant glass substrate 101 having a thickness of about 0.3 to 1.0 mm which, preferably, is less subject to deformation and shrinkage under heat processing of 400 to 600° C. is prepared. On the glass substrate 101, a SiN film 102 having a thickness of about 50 nm and a SiO film 103 having a thickness of about 50 nm, which function as thermal and chemical barrier films, are formed continuously and uniformly by a CVD method, and an amorphous silicon film 104 having a thickness of about 50 nm is formed on the barrier film by the CVD method. The formations of barrier films and amorphous silicon film are known to those skilled in the art. After that, only a pixel portion is irradiated with the laser light by employing the laser light irradiation method of the present invention to modify a portion of the amorphous silicon film on which pixel circuits are to be formed into a polysilicon film 105.

FIG. 1b is a sectional view showing a state in which the portion of amorphous silicon film is modified into the polysilicon film through the use of the laser light irradiation. The device shown in FIG. 3 may be used for implementing the laser light irradiation shown in FIG. 1B. The laser light irradiation technique described below, using the irradiation device in FIG. 3, was earlier described in this Specification. The glass substrate 101 on which the amorphous silicon film 104 is deposited is placed on a driving stage 201 movable in xy directions to perform positioning of the glass substrate 101 using a reference position measurement camera 202. A reference position measurement signal 203 is inputted to a controller 204, and then fine adjustment of the irradiation position is performed based on a control signal 206 inputted to a driving equipment 205, so that the stage 201 is moved at a predetermined speed to effect scanning in one direction (x direction in FIG. 1C). In synchronization with the scanning, laser light 208, which is emitted from irradiation equipment 207, is directed to the amorphous silicon film 104 so as to modify the silicon film.

As described above, a desired irradiation beam can be formed by arranging a laser light source 209 of 1 W composed of a second harmonic (wavelength: 532 nm) of LD (laser diode)-excited Nd:YVO4 laser, an optical system 210 such as a homogenizer, a reflection mirror 211, and a condensation lens system 212. Irradiation period, irradiation strength and so forth are adjusted by an ON-OFF signal 213 and a control signal 214 from the controller 204.

FIG. 4 is a flowchart showing a laser light irradiation sequence using the irradiation equipment of FIG. 3. In the present invention, the laser light may preferably be adjusted optically so as to achieve a uniform spatial distribution of intensity and then condensed using the lens system for irradiation. In order to adjust crystallinity of the modified silicon film, it is preferred to use continuous oscillation laser light which is formed optically and pulsed for irradiation. A pulse width of the laser may preferably be selected from the range of 100 ns to 1 ms, and, for example, 10-μs-pulse width may be selected as an optimum condition for the achievement of a grain size of 5 μm.

FIG. 2 is the plan view schematically showing the irradiation portions of the substrate, from which it is apparent that the modified silicon films can be formed in a stripe shape according to the present embodiment. Since an irradiation beam diameter of the laser light is required to be larger than a width of a circuit portion of the pixel portion, 30 μm in diameter is selected by way of example.

As shown in FIG. 8, it is preferable to employ a two-dimensional reciprocation irradiation method wherein a surface of the substrate is scanned for the irradiation with the laser beam firstly in x direction (A-direction in FIG. 8, which is referred to as one direction in the foregoing description), and then shifted to y direction to be scanned for the irradiation with the laser light in the reverse direction (B). A scanning speed of 300 m/s, for example, is employed for the irradiation. It is possible to modify the silicon films on all the pixel portions into polysilicon films of good quality by repeating the reciprocation. Each of the modified polysilicon films has a single crystal area along the laser light irradiation direction, wherein a crystalline form is characterized by asymmetrical growth in one direction as shown in FIG. 6.

The modified silicon film 105 formed in the above-described manner is subjected to an etching process to form a predetermined circuit as shown in FIG. 1C, and then a gate insulating film (not shown), a gate electrode (gate electrode GT shown in FIG. 6B) 106, source/drain wiring 107, an interlayer insulating films 108, passivation film 109, and a transparent electrode 110 which is used as the pixel electrode are formed in this order, to thereby obtain an active-matrix substrate on which the pixel circuit is provided with the transistor circuit formed by using the modified silicon film 105.

In the formation of transistor circuit, a moving direction of electrons or holes on the gate portion may preferably be coincident with and in parallel with the, crystal growth direction. As used herein, "coincident with and in parallel with" means that an angle made by the moving direction with respect to the crystal growth direction of the polysilicon film is 0 or 180 degrees. Tolerance of the angle is 30 degrees or less, and the reason therefor is shown in Table 1.

TABLE 1

| Angle (deg.) | Electron Mobility |
|---|---|
| 0 | 520 |
| 30 | 500 |
| 60 | 260 |
| 90 | 150 |
| 120 | 220 |
| 150 | 510 |
| 180 | 580 |

Shown in Table 1 are results of study regarding the relationship between angles made by the direction of electron movement with the scanning direction of laser light irradiation (angle: deg.) and electron mobility (cm$^2$/V·s). As shown in Table 1, if the angle of deviation of the electron moving direction (absolute value) from the crystal growth direction, which is defined by the scanning direction of the laser light irradiation, is 30 degrees or less with respect to 0 or 180 degrees, electron mobility of about 300 cm$^2$/V·s or more is sufficiently ensured. In turn, it has been found that the electron mobility is reduced if the angle of deviation from the crystal growth direction exceeds 30 degrees and that the electron mobility is sharply reduced if the angle is 90 degrees. The present embodiment is accomplished based on the findings. The findings are adopted in other embodiments of the present invention.

The characteristic orientation of electrons or holes is achieved because the present embodiment allows the reciprocation of the laser light irradiation. In the case where layouts of pixel circuits are identical to each other, the pixel circuit portion (scanning portion in the A direction in FIG. 8) formed on the laser irradiation portion 403 in the forward direction and the pixel portion (scanning portion in the B direction in FIG. 8) formed on the laser irradiation portion 403 in the backward direction have a difference in the angle formed, by the carrier moving direction with the crystal growth direction of 0 or 180 degrees. The present invention including the present embodiment allows the two kinds of orientation of 0 degree and 180 degrees due to the findings that such difference between the orientation angles hardly affect the transistor properties. It should be emphasized that the above described non-obvious findings have enabled the reciprocation irradiation.

Since it is possible to diminish the probability of the carriers passing through the crystal grain boundaries owing to the positive crystalline direction orientation, deterioration in properties resulting from scattering of the grain boundaries is minimized, thereby enabling the excellent transistor circuit to be obtained. Details of processing techniques relating to the process of fabricating the transistor circuit and electrodes are known to those skilled in the art. Further, the necessity of adding processes such as ion implantation and activation annealing to the fabrication process is also known to those skilled in the art.

The thin film transistor circuits formed by using the polysilicon semiconductor film are arranged on the pixel portion by the above-described method. In the case of manufacturing an N-channel MIS transistor, for example, the performance of the thin film transistor obtained from the present embodiment is as follows: electric field effect mobility is about 300 cm$^2$/V·s or more, and variations in a threshold value voltage are suppressed to ±0.2 V or less. Thus, a display device can be manufactured by using an active-matrix substrate excellent in uniformity between devices which operates with high-performance and high reliability.

Further, according to the present embodiment, a P-channel MIS transistor can be fabricated by replacing the phosphoric ion implantation for imparting electron carrier with boron implantation for imparting hole carrier, and the so-called CMOS type circuit can be fabricated by changing positions of photomasks to form an N-type and P-type transistors on an identical substrate. Since improvements in frequency characteristics are expected with the CMOS type circuit, the circuit is suitably used for high speed operation. On the other hand, an increase in the number of fabrication steps caused by an increase in the number of masks is contrary to the improvement. Details of the semiconductor fabrication technique and semiconductor circuit technology are known to those skilled in the art, and it is desirable to select the semiconductor device to be constructed in view of properties required for the display device and fabrication cost.

Technical methods for manufacturing a liquid crystal display device using the active-matrix substrate of the present embodiment are known to those skilled in the art. Specifically, a liquid crystal cell is formed by: forming a liquid crystal orientation film on the active-matrix substrate; imparting an orientation regulation property to the film by rubbing or the like; forming a sealant around the pixel portion; arranging color filter substrates each having the orientation film with predetermined spacing so that each two of them face to each other; filling a gap between the color filter substrates with liquid crystal; and closing the inlet of the sealant with another sealing compound.

After that, a liquid crystal display module is obtained by mounting a gate driver LSI and a source driver LSI on the periphery of the liquid crystal cell. A liquid crystal display device is manufactured by mounting a polarization plate, a light conductor plate, a backlight and so forth on the liquid crystal display module.

The liquid crystal display device manufactured by using the active-matrix substrate of the present embodiment is suitable for high speed operation since it is excellent in current driving ability due to the above-described excellent polysilicon thin film transistor circuit which is arranged for each of the pixel circuits. Further, since the variations in the threshold voltage are reduced by using the active-matrix substrate, the liquid crystal display device is inexpensive and excellent in uniformity of image quality.

Technical methods for manufacturing an organic EL display device using the active-matrix substrate of the present embodiment are known to those skilled in the art. Specifically, a bank pattern for separating an organic EL element is formed on the active-matrix substrate, and then a layered body consisting of a transparent surface, a hole transporting layer, a luminescent layer, an electron transporting layer, a cathode metal layer and so forth in this order is formed by vapor deposition. A sealant is formed around a pixel portion of the substrate having the layered body and sealing is performed with a sealing can. Such sealing technique protects the organic EL element of the pixel portion from moisture, etc. The protection of organic EL element from moisture, etc. is necessary for suppressing deterioration in image quality, and it is recommended to provide the sealing can with a desiccant.

In active-matrix driving for the organic EL display device, high performance pixel circuits must be used for the provision of excellent images since the current-driven light emission method is employed for the organic EL element, and it is particularly desirable to use CMOS type pixel circuits. The active-matrix substrate of the present embodiment is suitably used as the high performance active-matrix substrate for meeting such demand, and it should be emphasized that the organic EL display device manufactured by using the active-matrix substrate is one of display devices which best manifest the characteristics of the present embodiment.

Second Embodiment

In a second embodiment, a silicon film which is the object of modification by laser light irradiation is not limited to an amorphous silicon film; the silicon film may be a polysilicon film formed by modifying the amorphous silicon film, and a modified silicon film of a pixel portion may be a further modified polysilicon film. Further, in the present embodiment, the silicon film of the pixel portion may be a polysilicon film formed by sputtering and the modified silicon film on the pixel portion may be the further modified polysilicon film. Moreover, a combined use of a polysilicon film formed by a CVD method as the silicon film of the pixel portion and the further modified polysilicon film as the modified silicon film of the pixel portion is also possible. A mode of the present embodiment wherein a silicon film different from that of the first embodiment is modified will hereinafter be described with reference to the drawings referred to in the first embodiment.

In the same manner as in the first embodiment, a heat-resistant glass substrate 101 having a thickness of about 0.3 to 1.0 mm which, preferably, is less subject to deformation and shrinkage under heat processing of 400 to 600° C. is prepared. On the glass substrate 101, a SiN film 102 having a thickness of about 50 nm and a SiO film 103 having a thickness of about 50 nm, which function as thermal and chemical barrier films, are formed continuously and uniformly by the CVD method, and an amorphous silicon film 104 having a thickness of about 50 nm is formed on the barrier film by the CVD method (see FIG. 1A).

Figure 26A:
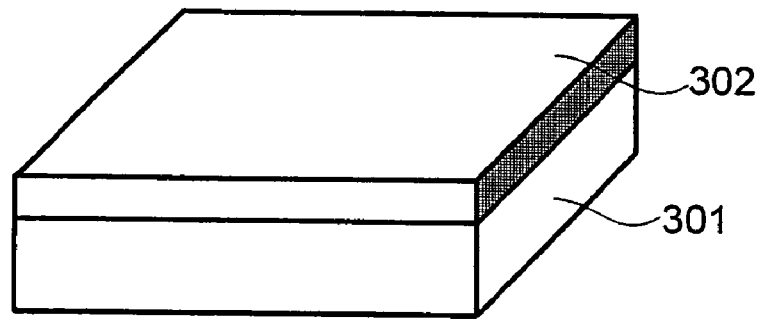
FIGS. 26A and 26B are stereograms for illustrating a typical method of crystallization by scanning of excimer pulsed laser light irradiation.
Figure 26B:
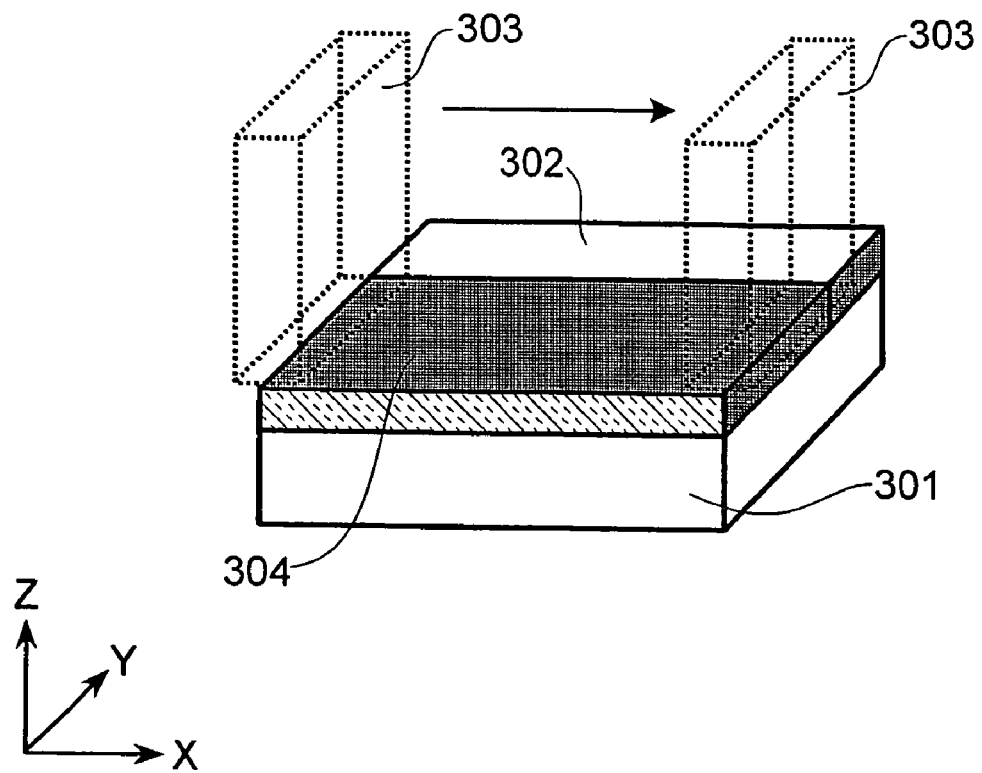
Figure 27A:
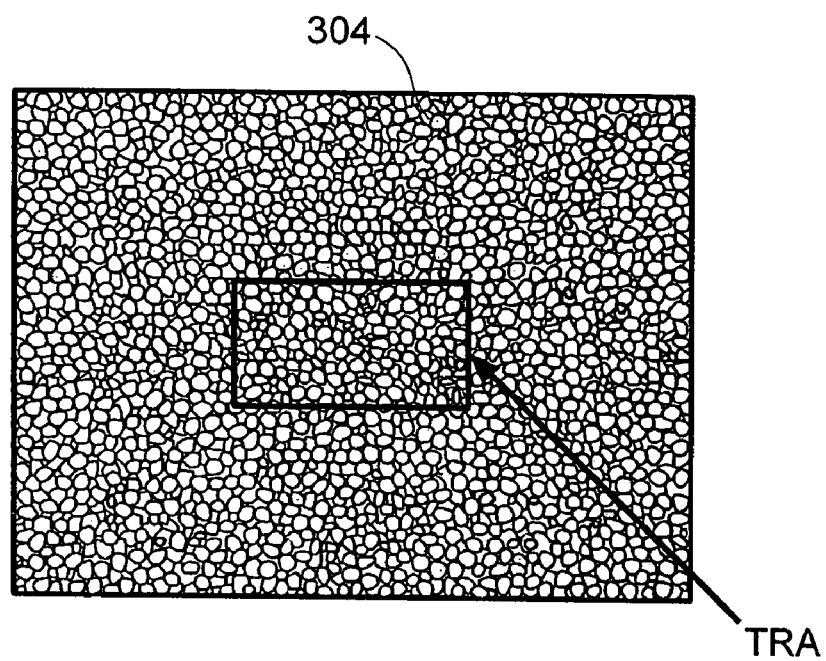
FIG. 27A is a plan view showing part of the laser light irradiation portion of FIG. 26B.
Figure 27B:
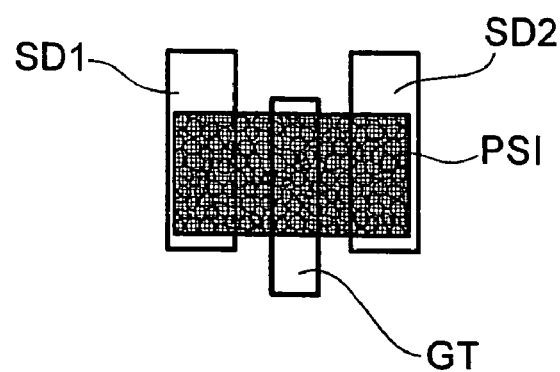
FIG. 27B is a plan view showing a main part of the thin film transistor of FIG. 26B.

A crystallization method wherein the amorphous silicon film is subjected to scanning of excimer pulsed laser light irradiation will be described referring to FIGS. 26A and 26B in addition to the above-mentioned drawings. As shown in FIG. 26A, an amorphous silicon film 302 deposited on a glass substrate 301 having an undercoating layer (not shown) is irradiated with a linear excimer laser beam 303 having a width of several millimeters to several hundreds of millimeters while changing laser irradiation positions by 1 to several pulses by scanning to modify a wide area of the amorphous silicon film 302 into a silicon film 304. The amorphous silicon film is modified into the polysilicon film by the wide area irradiation performed for the whole substrate surface.

It is possible to further improve the crystallinity of polysilicon by subjecting the silicon film modified by the excimer pulsed laser light to the laser light irradiation modification in the same manner as in the first embodiment. In the present embodiment, it is possible to form the active-matrix substrate and the liquid crystal display device using the active-matrix substrate in the same manner as in the first embodiment after the laser light irradiation modification of the present embodiment.

The characteristic point of the present embodiment which should be noted is that, although it uses the silicon film on which fine crystals have been generated by the excimer pulsed laser light irradiation, the polysilicon film generated by laser light irradiation is not different from the polysilicon film which is generated by using the amorphous silicon film as a starting material. That is to say, even if the excimer pulsed laser light irradiation is performed, a thin film transistor formed by using the polysilicon film obtained by the present embodiment, such as an N-channel MIS transistor, enables the manufacture of an active-matrix substrate which has electric field effect mobility of about 300 $cm^2/V \cdot s$, suppresses variation in a threshold voltage to ±0.2 V or less, achieves high performance and high degree of reliability in operation, and exhibits excellent uniformity among devices. Moreover, it is possible to obtain a high quality display device by the use of the active-matrix substrate.

It is possible to crystallize the amorphous silicon by using the excimer pulsed laser light irradiation based on known findings in the art. In the crystallization, a polysilicon film composed of fine crystals each having a diameter of about 1 μm or less is obtained, and a thin film transistor formed by using the polysilicon film, such as an N-channel MIS transistor, has electric field effect mobility of about 100 $cm^2/V \cdot s$ and a high degree of variation in the threshold voltage. As a result of comparison with the known findings, it is possible to confirm one of the excellent effects achieved by the present embodiment.

Third Embodiment

In a third embodiment, a silicon film which is the object of modification by laser light irradiation is not limited to an amorphous silicon film. The silicon film may be a polysilicon film formed by modifying the amorphous silicon film and a modified silicon film of a pixel portion may be a further modified polysilicon film as described in the second embodiment. Further, in the present embodiment, the silicon film of pixel portion may be a polysilicon film formed by sputtering and the modified silicon film of pixel portion may be the further modified polysilicon film. Moreover, a combined use of a polysilicon film formed by CVD as the silicon film of the pixel portion and the further modified polysilicon film as the modified silicon film of the pixel portion is also possible. Another embodiment of the invention wherein a silicon film different from that of the foregoing embodiments is modified will hereinafter be described with reference to FIGS. 9A to 9C.

Figure 9A:
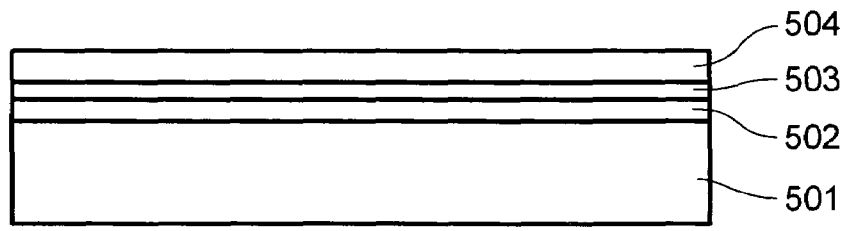
FIGS. 9A to 9C are sectional views schematically showing the steps of forming an active-matrix substrate of a display device according to a third embodiment of the present invention.
Figure 9B:
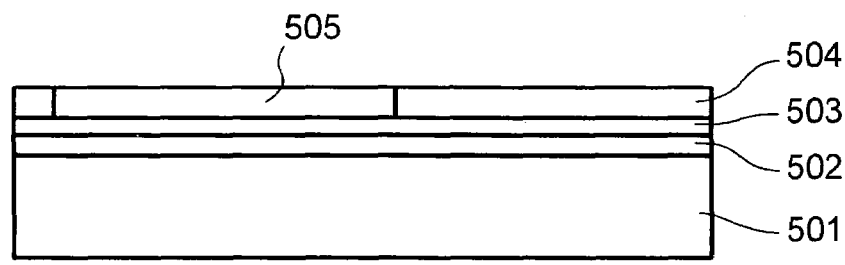
Figure 9C:
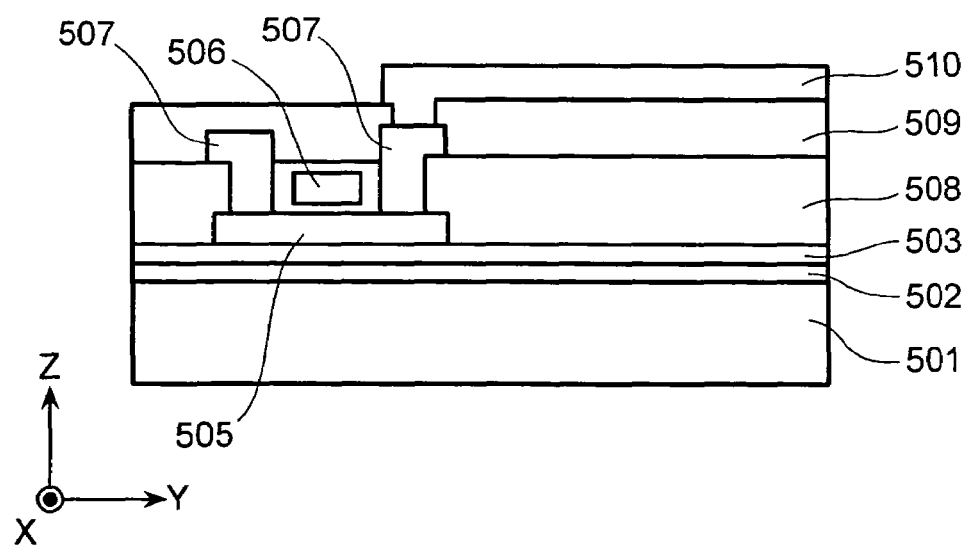

FIGS. 9A to 9C are sectional views schematically showing the steps of forming an active-matrix substrate of the present embodiment of the display device according to the present invention. In the same manner as in the first embodiment, a heat-resistant glass substrate 501 having a thickness of about 0.3 to 1.0 mm which, preferably, is less subject to deformation and shrinkage under heat processing of 400 to 600° C. is prepared. On the glass substrate 501, a SiN film 502 having a thickness of about 50 nm and a SiO film 503 having a thickness of about 50 nm, which function as thermal and chemical barrier films, are formed continuously and uniformly by the CVD method, and then an amorphous silicon film 504 having a thickness of about 50 nm is formed on the barrier film by the CVD method (see FIG. 9A).

After that, only the pixel portion is irradiated with laser light employing the laser light irradiation method by the use of the device described in the first embodiment to modify the silicon film, on which pixel circuits are to be formed, from the amorphous silicon film 504 into the polysilicon film 505 (see FIG. 9B). The thus modified silicon film 505 is subjected to etching to form a predetermined circuit shown in FIG. 9C, and then a gate insulating film (not shown), gate wiring (to be used as a gate electrode) 506, a source/drain wiring 507, an interlayer insulating film 508, a passivation film 509, and a transparent electrode 510 which is used as a pixel electrode are formed in this order, to thereby obtain the active-matrix substrate on which each of the pixel circuits are provided with the transistor circuit formed by using the modified silicon film 505.

In the formation of transistor circuits, a moving direction of electrons or holes on a gate portion, preferably, is coincident with and in parallel with a crystal growth direction such as described in the first embodiment.

There occurs a difference in angle of 0 or 180 degrees between a carrier moving direction and a crystalline growth direction of the thin film transistors of the pixel portion because of the difference in crystalline growth directions due to the reciprocation operation of laser light irradiation used, also, in the present embodiment. Herein, also, such a difference in the crystalline growth directions hardly affects the transistor properties such as the relationship between the angle (absolute value) made by the electron moving direction with the crystalline growth direction, which is defined by the laser scanning direction, of the present embodiment, as described in the first embodiment with reference to Table 1.

The thin film transistor provided on the active-matrix substrate of the present embodiment has properties as excellent as those of the first and second embodiments. For example, in the case of forming an N-channel MIS transistor, it is possible to achieve electric field effect mobility of about 300 $cm^2/V \cdot s$ or more and suppress variations in threshold voltage to $\pm 0.2$ V or less.

The active-matrix substrate of the present embodiment may be used with regard to a known manufacturing technique for a liquid crystal display device such as described in the first and second embodiments. The liquid crystal display device manufactured by using the active-matrix substrate is capable of high-speed display, is excellent in uniformity of image quality, and is inexpensive.

Fourth Embodiment

In a fourth embodiment, a silicon film which is the object of modification by laser light irradiation is not limited to an amorphous silicon film. The silicon film may be a polysilicon film formed by modifying the amorphous silicon film, and a modified silicon film of a pixel portion may be a further modified polysilicon film. Further, in the present embodiment, the silicon film of the pixel portion may be a polysilicon film formed by sputtering and the modified silicon film of the pixel portion may be the further modified polysilicon film. Moreover, a combined use of a polysilicon film formed by a CVD method as the silicon film of the pixel portion and the further modified polysilicon film as the modified silicon film of the pixel portion is also possible.

In the same manner as in the first embodiment, a heat-resistant glass substrate 501 having a thickness of about 0.3 to 1.0 mm which, preferably, is less subject to deformation and shrinkage under heat processing of 400 to 600° C. is prepared. On the glass substrate 501, a SiN film 502 having a thickness of about 50 nm and a SiO film 503 having a thickness of about 50 nm, which function as thermal and chemical barrier films, are formed continuously and uniformly by a CVD method, and then a polysilicon film having a thickness of about 50 nm is formed on the barrier film by the CVD method.

The technique of depositing the polysilicon film by the CVD method is known to those skilled in the art, but the polysilicon film of the present embodiment, obtained through the CVD method, is largely improved in crystallinity. An effect of the present embodiment is to achieve a stable polysilicon film by the laser light irradiation without depending on the type of the silicon film undergoing the irradiation, and the present embodiment is characterized by the effect.

The active-matrix substrate of the present embodiment may be used with regard to a known manufacturing technique for a liquid crystal display device such as described in the first to third embodiments. The liquid crystal display device manufactured by using the active-matrix substrate of the present embodiment is capable, also, of high speed display, is excellent in uniformity of image quality, and is inexpensive.

Fifth Embodiment

A fifth embodiment will hereinafter be described with reference to FIGS. 10 to 15. Arrangement of pixel circuits on an active-matrix substrate is contrived as a mode for carrying out the present invention in the present embodiment, and the present embodiment enables great improvement in efficiency of laser irradiation.

Figure 10:
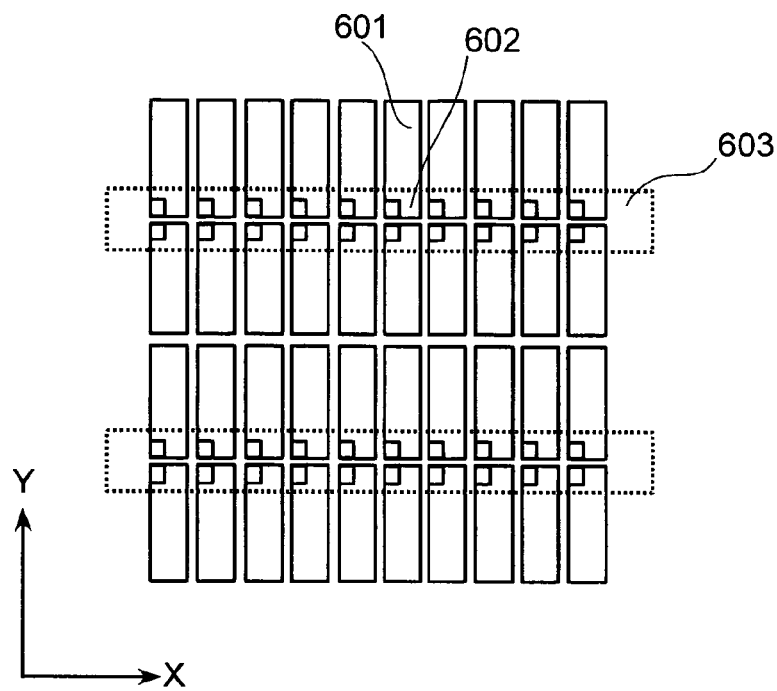
FIG. 10 is a plan view showing a laser irradiation portion pattern according to a fifth embodiment of the present invention.
Figure 11:
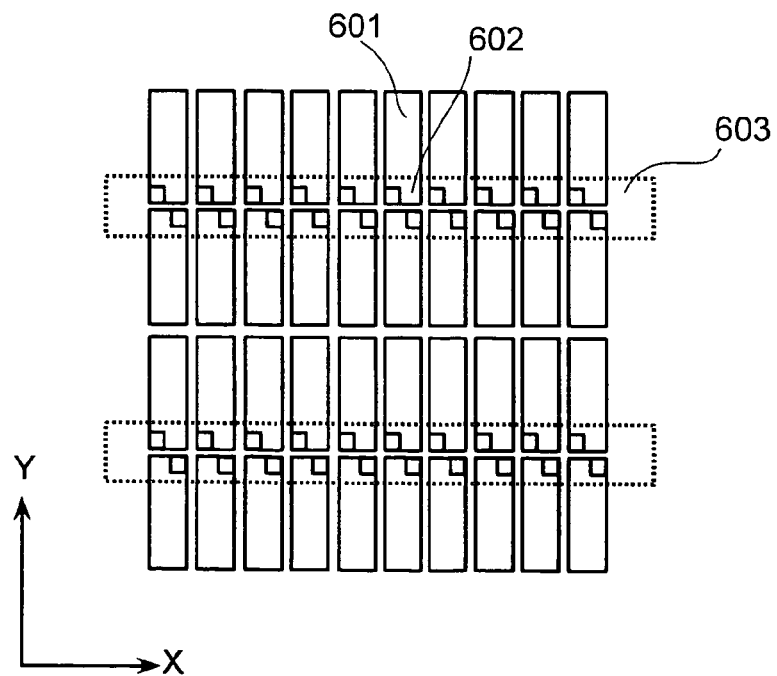
FIG. 11 is a plan view showing another laser irradiation portion pattern according to the fifth embodiment.
Figure 12:
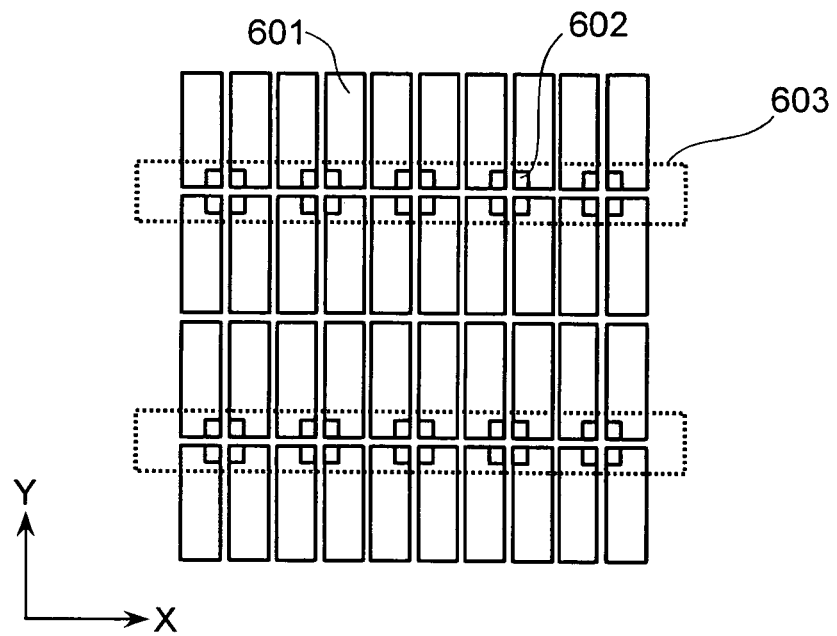
FIG. 12 is a plan view showing still another laser irradiation portion pattern according to the fifth embodiment.
Figure 13:
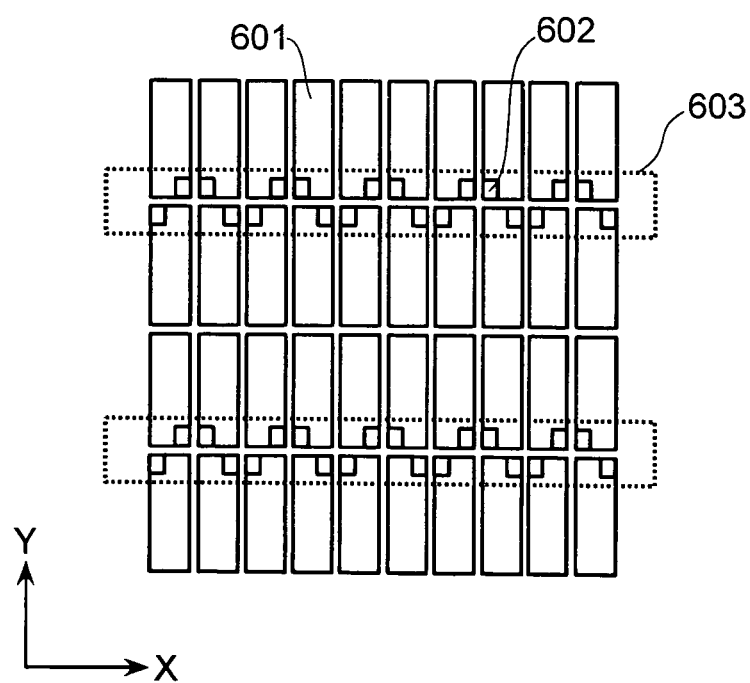
FIG. 13 is a plan view showing a further laser irradiation portion pattern according to the fifth embodiment.
Figure 14:
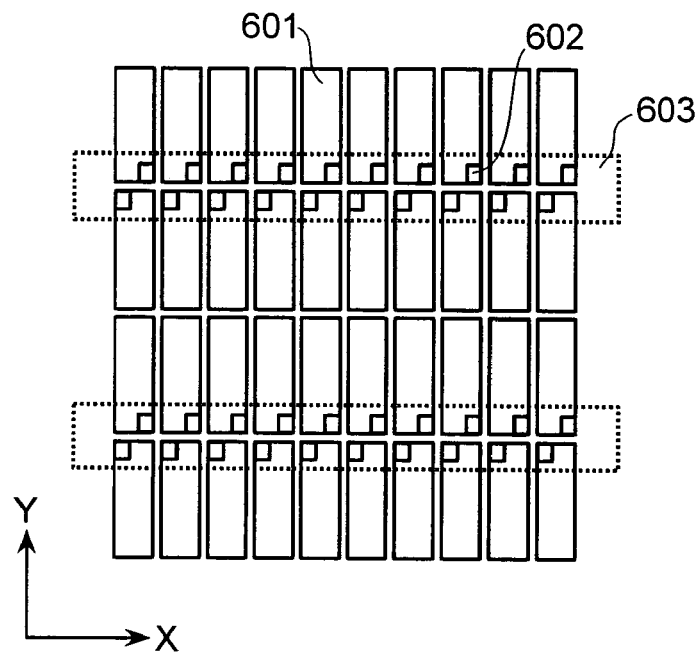
FIG. 14 is a plan view showing another laser irradiation portion pattern according to the fifth embodiment.
Figure 15:
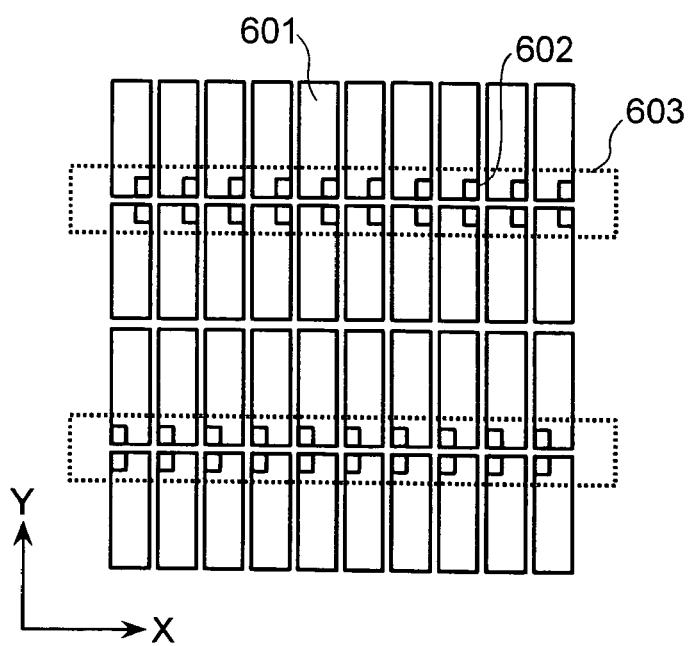
FIG. 15 is a plan view showing a still other laser irradiation portion pattern according to the fifth embodiment.

FIG. 10 is a plan view showing a laser irradiation portion pattern of according to the present embodiment; FIG. 11 is a plan view showing another laser irradiation portion pattern according to the present embodiment; FIG. 12 is a plan view showing still another laser irradiation portion pattern according to the present embodiment; FIG. 13 is a plan view showing a further laser irradiation portion pattern according to the present embodiment; FIG. 14 is a plan view showing another laser irradiation portion pattern according to the present embodiment; and FIG. 15 is a plan view showing a still other laser irradiation portion pattern according to the present embodiment.

In each of the laser irradiation portion patterns shown in FIGS. 10 to 15, each of pixel portions consists of an array of pixels 601 arranged along x direction at regular intervals, and each of the pixels has a circuit portion 602. The pixel portions are arranged in such a fashion that the circuit portions 602 of two pixel portions which are adjacent to each other along the y direction are arranged collectively at the center of the two pixel portions.

Efficiency of the laser irradiation is nearly doubled by setting only the pixel portions on which the circuit portions are collectively arranged as a selective laser irradiation portion 603. The laser irradiation portion patterns are characterized in that an arrangement pitch of pixel circuits is equal to twice that of pixels.

The arrangement of pixels is not limited to those shown in FIGS. 10 to 15; however, it should be noted that any pixel arrangements wherein the arrangement pitch of pixel circuits is equal to twice that of the pixels are included in the present embodiment. Choice of arrangement should be optimized in view of wiring on the gate and source sides of a thin film transistor to be formed, the layout of pixel circuits (pixel arrangement), and a driving method for the pixel circuits.

A method for manufacturing an active-matrix substrate may be the same as that described in the first embodiment, and efficiency of irradiation is increased to as high as twice that of the first embodiment as a result of changing a width of the laser irradiation to about 70 μm in accordance with the collective arrangement. It should be emphasized that reciprocation scanning is applicable to the laser irradiation for the above-described pixel circuit arrangement.

Figure 16:
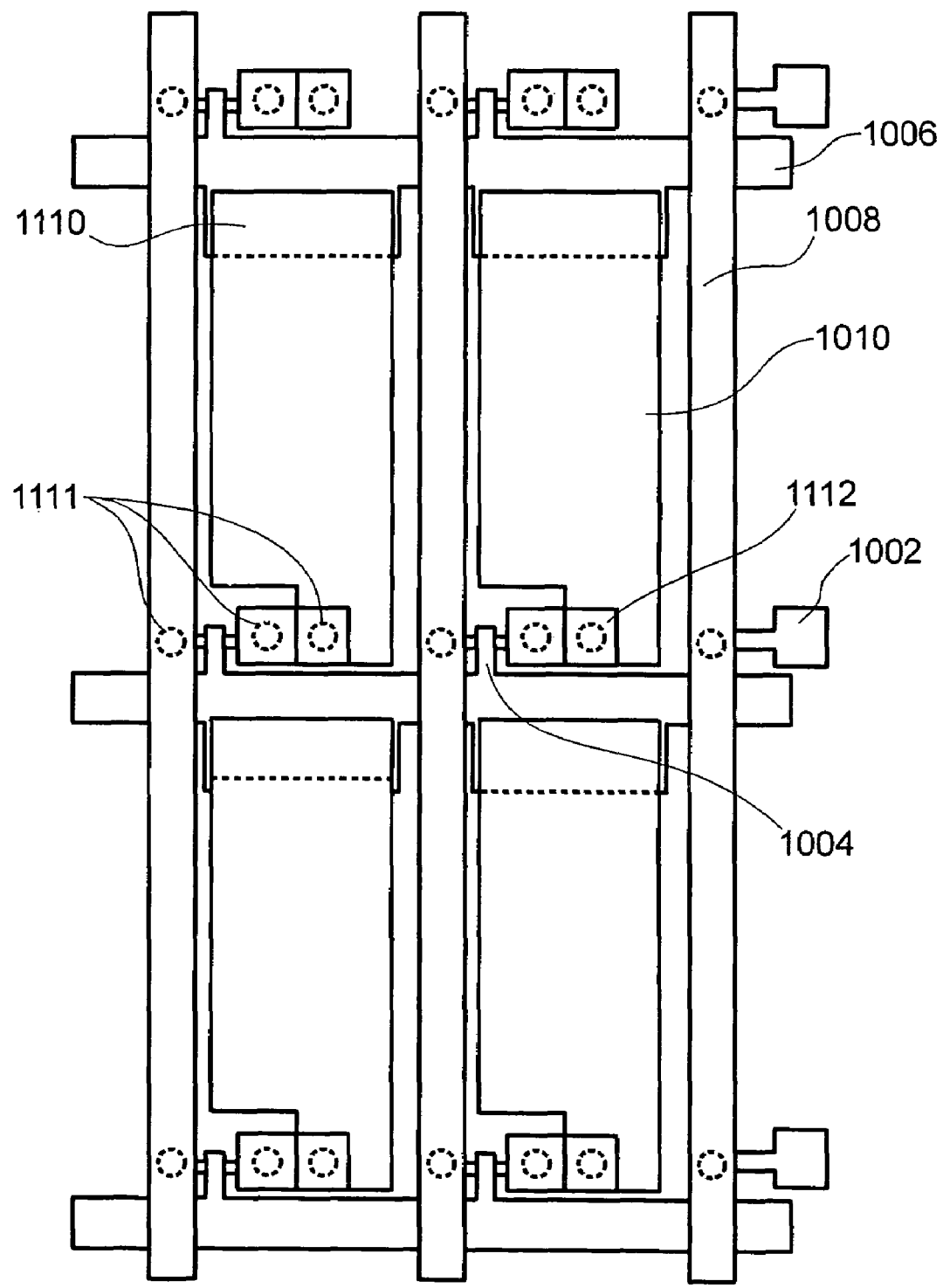
FIG. 16 is a plan view showing a layout of a pixel portion of a conventional TN liquid crystal display as an example comparable with the fifth embodiment.
Figure 17:
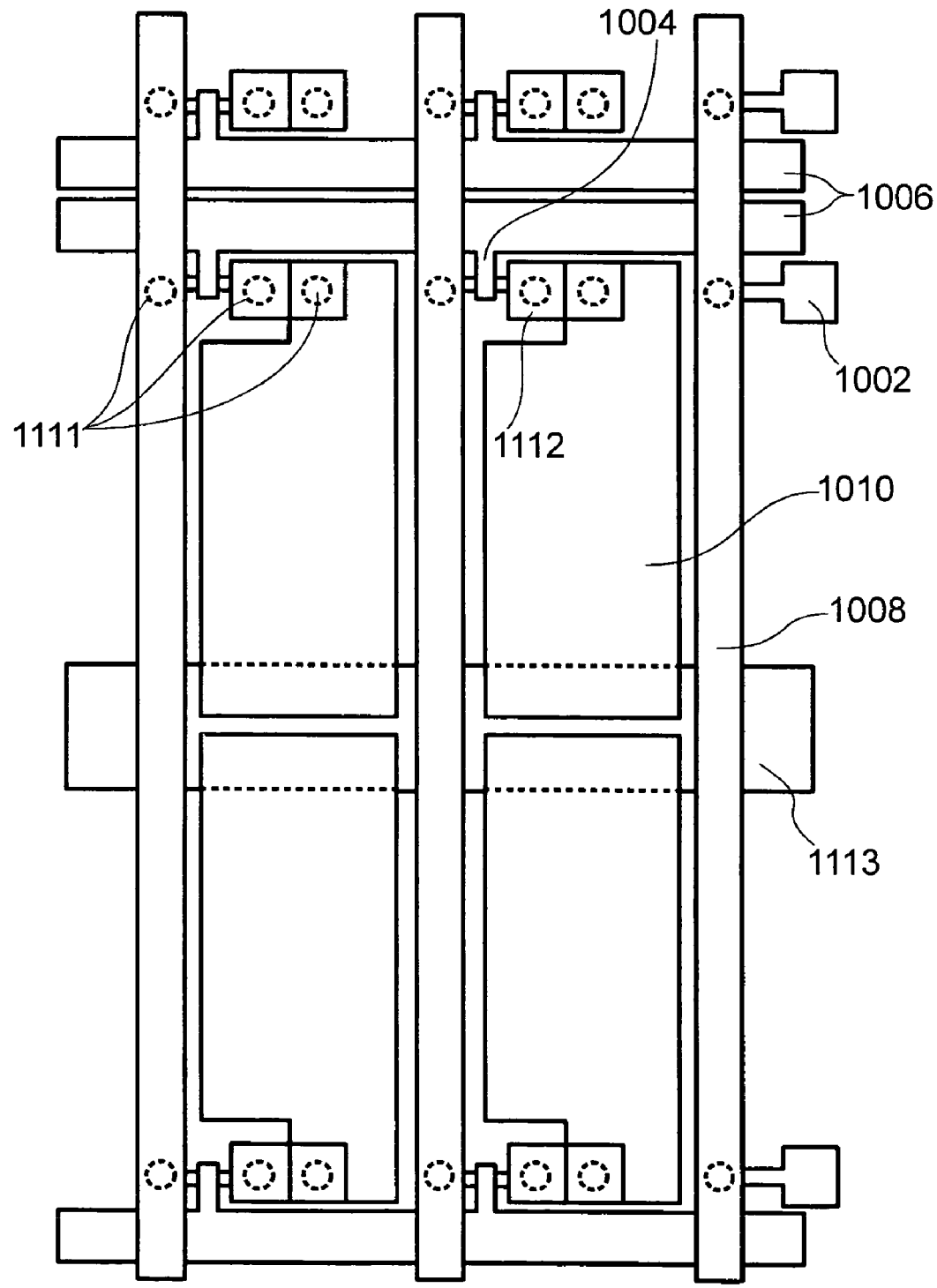
FIG. 17 is a plan view showing a layout of a pixel portion of a TN liquid crystal display according to the fifth embodiment.
Figure 18:
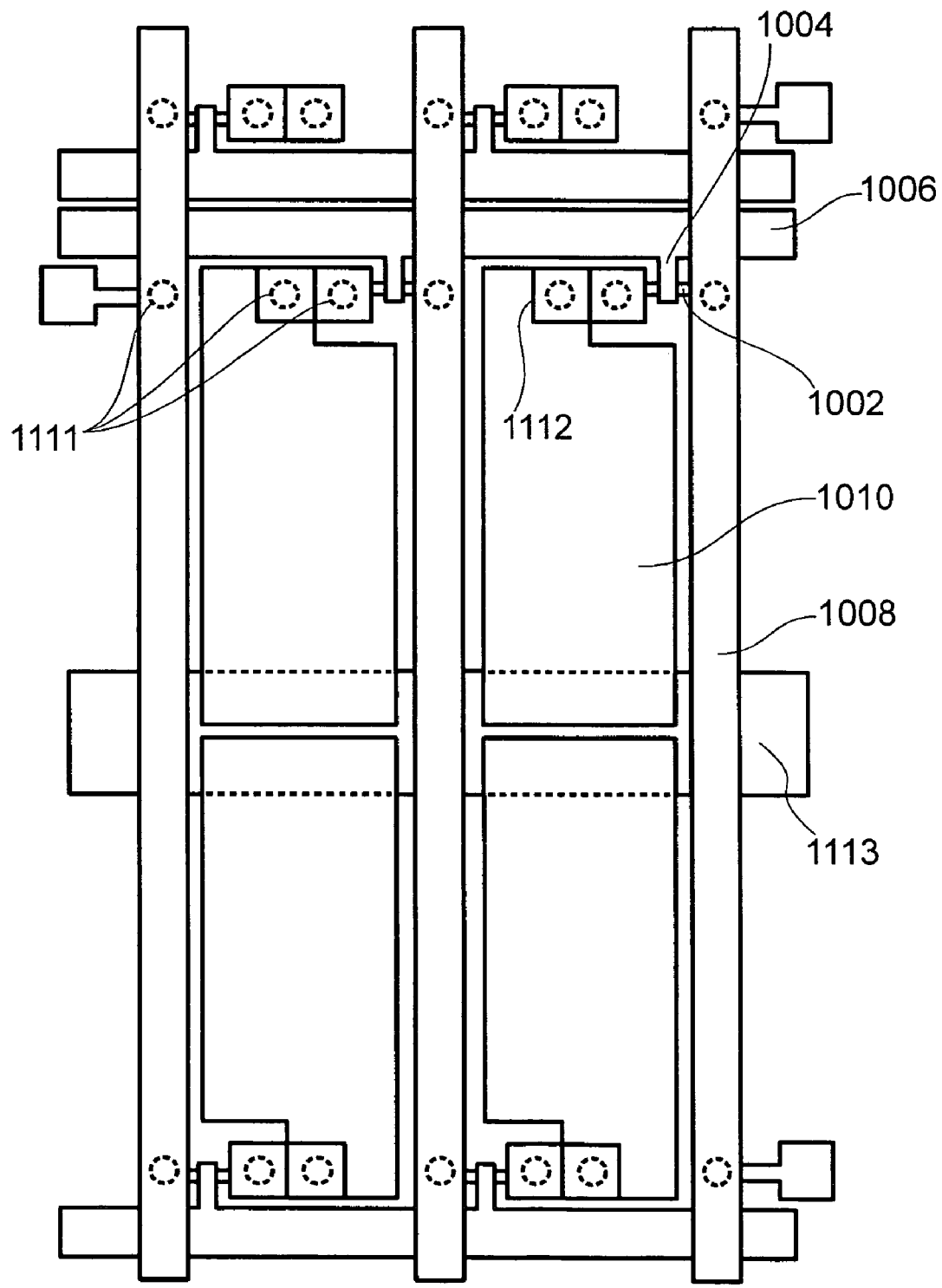
FIG. 18 is a plan view showing another layout of a pixel portion of a TN liquid crystal display according to the fifth embodiment.
Figure 19:
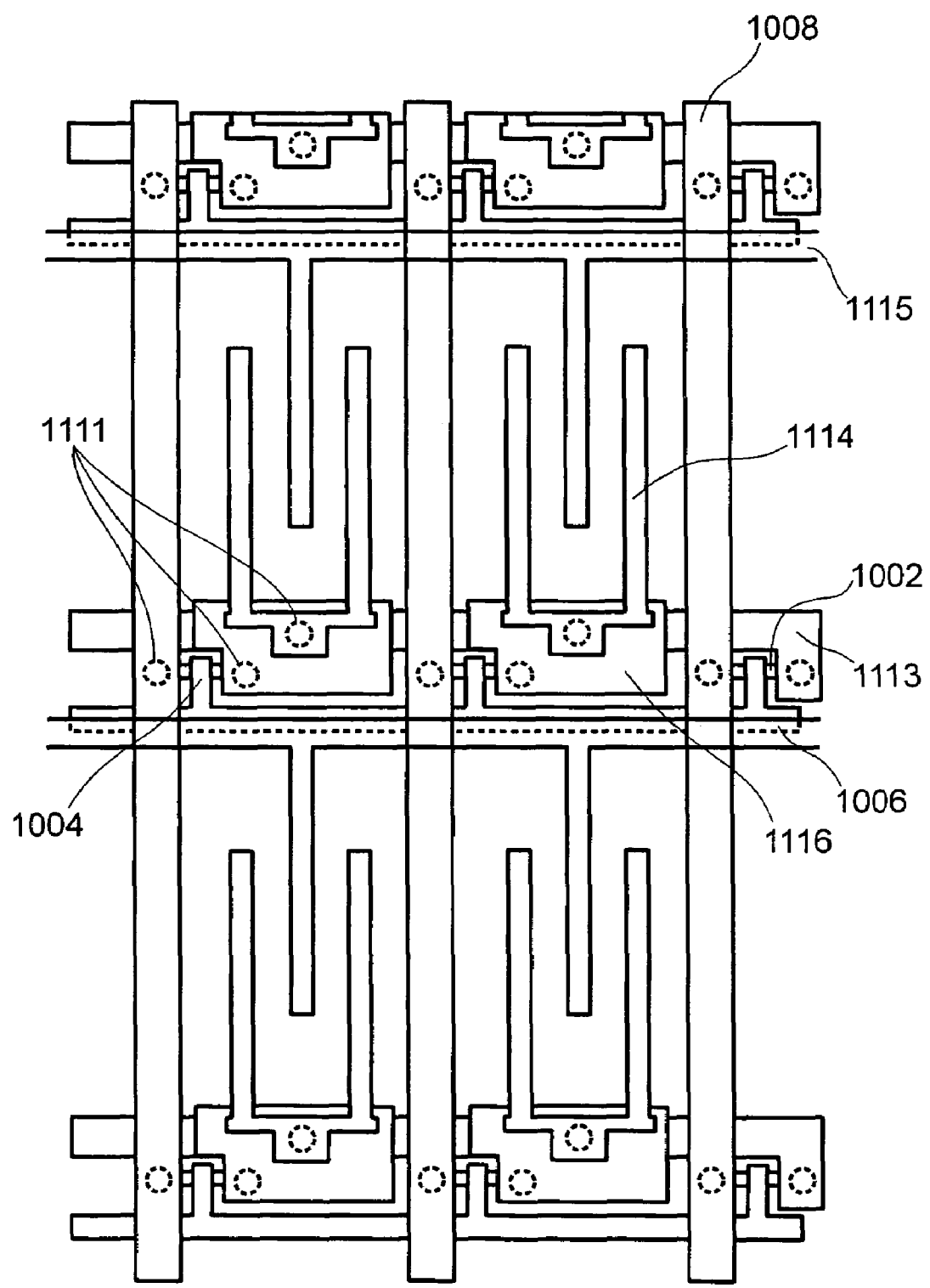
FIG. 19 is a plan view showing a layout of a pixel portion of a conventional IPS liquid crystal display as an example comparable with the fifth embodiment.
Figure 20:
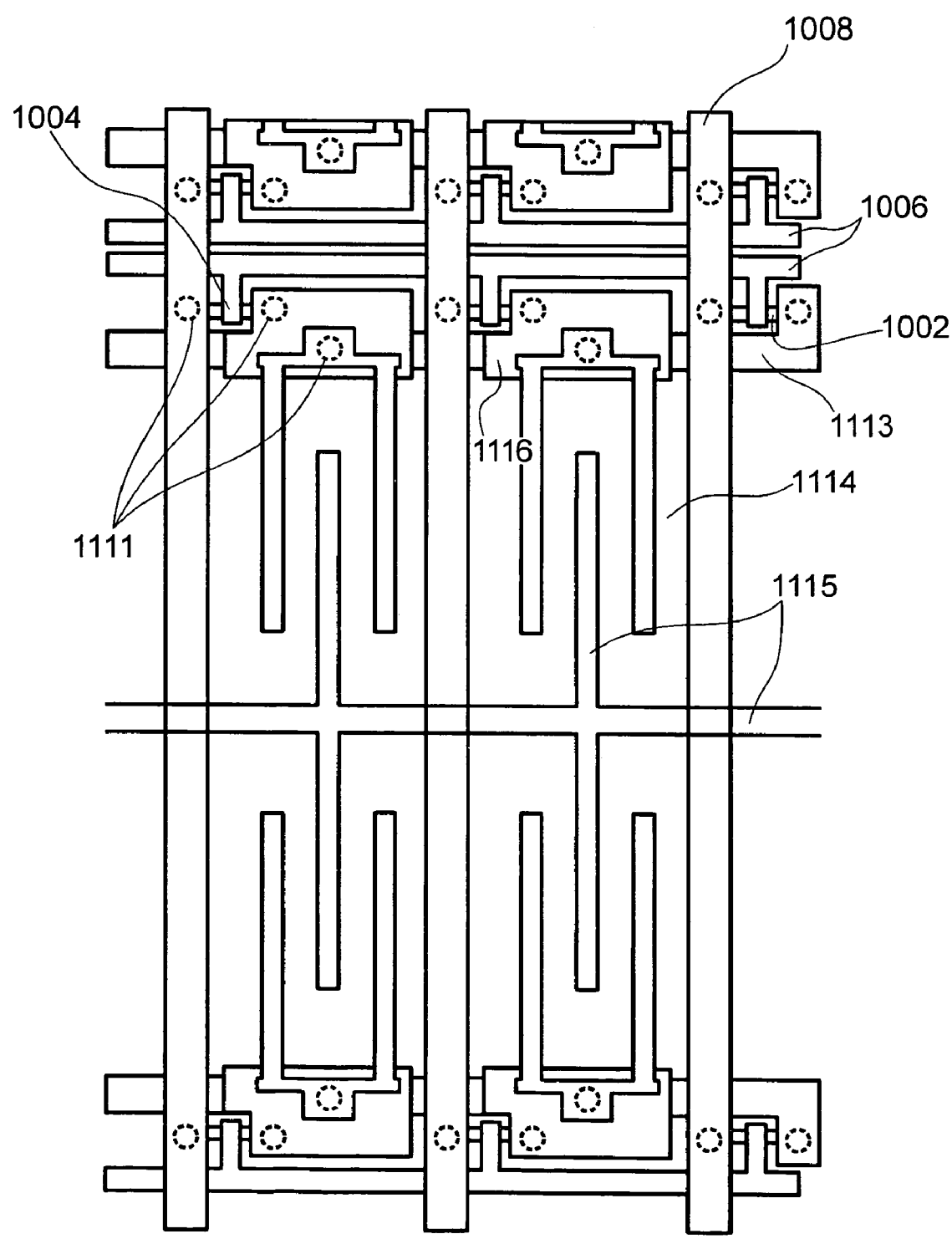
FIG. 20 is a plan view showing a layout of a pixel portion of an IPS liquid crystal display according to the fifth embodiment.
Figure 21:
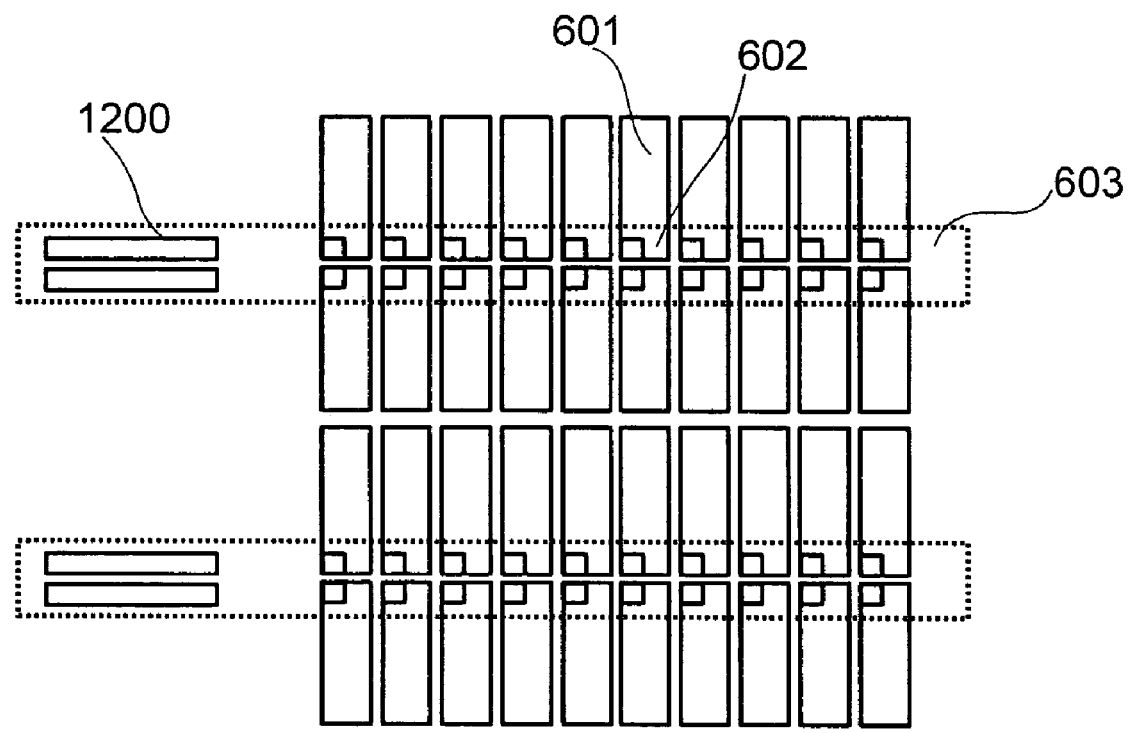
FIG. 21 is a plan view showing a laser light irradiation portion pattern including the pixel portions and peripheral circuit portions according to the fifth embodiment.

An arrangement (layout) of pixel portions for applying the present embodiment to a specific liquid crystal display device will hereinafter be described with reference to FIGS. 16 to 21. FIG. 16 is a plan view showing a layout of a pixel portion of a conventional TN liquid crystal display as an example comparable with the present embodiment; FIG. 17 is a plan view showing a layout of a pixel portion of a TN liquid crystal display according to the present embodiment; FIG. 18 is a plan view showing another layout of a pixel portion of a TN liquid crystal display according to the present embodiment; FIG. 19. is a plan view showing layout of a pixel portion of a conventional IPS liquid crystal display as an example comparable with the present embodiment; FIG. 20 is a plan view showing a layout of a pixel portion of an IPS liquid crystal display according to the present embodiment; and FIG. 21 is a plan view showing a laser light irradiation portion including pixel portions and peripheral circuit portions according to the present embodiment.

A typical pixel arrangement in a conventional TN (twisted nematic) type liquid crystal display device is as shown in FIG. 16, which is equivalent to that shown in FIG. 7. In the pixel arrangement of FIG. 16, a driving transistor having a gate 1004 provided with polysilicon 1002 is arranged at an intersection of gate wiring 1006 and data wiring 1008 which are arranged in a grid form, and communication is provided by source electrode 1112 and contact holes 1111 to control a voltage of a transparent electrode 1010 which is a pixel electrode. Storage capacitance 1110 for maintaining a display voltage is typically provided on an overlapping portion of the transparent electrode 1010 and the gate wiring 1006 of the preceding stage.

A typical pixel arrangement of a TN type liquid crystal display of the present invention is as shown in FIG. 17, which is equivalent to that shown in FIG. 16. More specifically, a collective thin film transistor arrangement is realized by arranging gate wiring 1006 for two pixels for each of data wiring 1008 disposed at regular intervals. However, in the collective thin film transistor arrangement, it is impossible to form storage by utilizing part of gate wiring of the preceding stage as in the conventional pixel arrangement shown in FIG. 16. Therefore, it is necessary that storage wiring 1113 be separately provided so as to form a storage capacitance on an overlapping portion of the storage wiring 1113 and the transparent electrode 1010. Owing to the above pixel arrangement, it is possible to manufacture the TN type liquid crystal display device only by changing a layout of exposure masks and without reducing an aperture ratio, the manufacture being effected by the same number of process steps as that of the conventional manufacturing process.

A typical pixel arrangement of another TN type liquid crystal display device of the present invention is shown in FIG. 18. The pixel arrangement is equivalent to that shown in FIG. 11. Owing to the pixel arrangement, it is also possible to manufacture the TN type liquid crystal display device only by changing a layout of exposure masks and without reducing an aperture ratio, the manufacture being effected by the same number of process steps as that of the conventional manufacturing process.

A typical pixel arrangement of a conventional in-plane switching (IPS) type liquid crystal display device is as shown in FIG. 19. The pixel arrangement is equivalent to that shown in FIG. 7. In the pixel arrangement of FIG. 19, a thin film transistor having a gate 1004 provided with polysilicon 1002 is arranged at an intersection of gate wiring 1006 and data wiring 1008 which are arranged in a grid form, and communication between a pixel electrode 1114 and a source electrode of the thin film transistor is provided through contact holes 1111 to control a voltage between a common electrode 1115 (counter electrode) and the pixel electrode 1114. Storage capacitance for maintaining the voltage is typically provided by disposing a storage electrode 1116 on storage wiring 1113 which is arranged in parallel with the gate wiring 1006.

A typical pixel arrangement of an IPS type liquid crystal display device of the present invention is as shown in FIG. 20, which is equivalent to that shown in FIG. 10. It is possible to realize a collective thin film transistor arrangement by collectively arranging two pieces of gate wiring 1006 for two pixels with respect to data wiring 1008 disposed at regular intervals. Also in this case, it is necessary to form storage by providing storage wiring 1113 in parallel with the gate wiring 1006. Owing to the pixel arrangement, it is also possible to manufacture the IPS type liquid crystal display device only by changing a layout of exposure masks and without reducing an aperture ratio, the manufacture being effected by the same number of process steps as that of the conventional manufacturing process.

As described in the present embodiment, it is possible to readily manufacture the liquid crystal display device through the application of the present invention. Also, an organic EL display device can be manufactured through the application of the present invention, likewise.

Although the single gate thin film transistor is used in the foregoing embodiments by way of example, the present invention is not to be construed as being limited thereto. More specifically, the liquid crystal display device can be manufactured by the use of the so-called double gate thin film transistor with the same pixel arrangement. In this case, an area for the thin film transistor is slightly increased, while manufacturing efficiency can be enhanced due to remarkable advantages such as suppression of off-leak current and improvements in withstand voltage. Therefore, the double gate thin film may preferably be used for actual manufacture of products.

The pixel portions and peripheral circuit portions can be formed simultaneously by employing the pixel arrangement of the present invention, i.e., by making the arrangement pitch of the gate driving circuits of the peripheral circuit portions (driving circuit portions), each of which being provided near the pixel portion, identical with that of thin film transistors of the pixel portions. More specifically, as shown in FIG. 21, a laser irradiation portion 603 of the pixel portions to be utilized for forming pixels 601 is extended to gate driving circuit portions 1200, which are the peripheral circuit portions, so as to form the peripheral circuits in the extended portion, thereby enhancing productivity of the active-matrix substrate by a large scale. In the case of forming the gate driving circuits 1200 in the extended portion of the laser irradiation portion 603, the gate driving circuit portions 1200 each having a voltage conversion, an impedance conversion, a shift resistor, various switches, a protection film, and so forth are realized by the use of the thin film transistor formed from the modified silicon film of the present invention. In the case of the above arrangement, the present invention is characterized in that the arrangement pitch of pixel circuit portions is equal to that of the peripheral circuit portions.

Sixth Embodiment

Laser light irradiation of a sixth embodiment enables modification of a silicon film of a peripheral circuit portion arranged near a pixel portion of an active-matrix substrate by employing the modification method wherein a silicon film on which pixel circuits are to be formed is modified to a high quality polysilicon film through the irradiation of the pixel portion with laser light, so that the peripheral circuit is formed by using a thin film transistor which is the same as that of the pixel portion.

Figure 22:
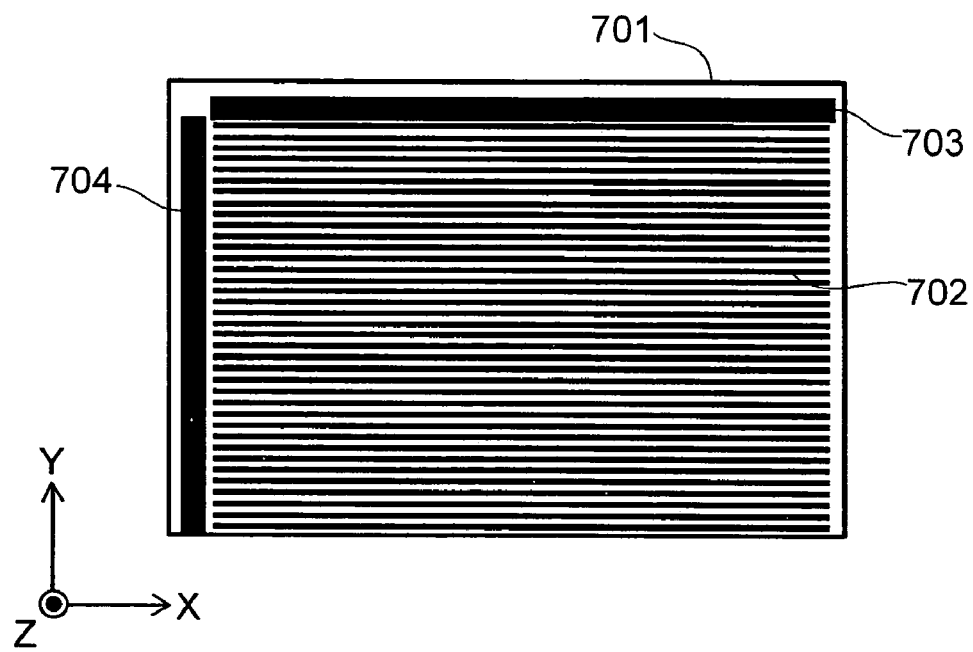
FIG. 22 is a plan view showing an active-matrix substrate, according to a sixth embodiment of the present invention.

FIG. 22 is a plan view showing an active-matrix substrate according to the present embodiment. In the present embodiment, a modified portion is formed in a polysilicon film 702 by laser light irradiation in a stripe shape along x direction only on the pixel portions of an amorphous silicon film 701 which is deposited on a glass substrate in the same manner as in the first embodiment. A region of each of the peripheral circuit portions 703 and 704 is irradiated with the laser light in the same manner as in the first embodiment. In FIG. 22, the region on the peripheral circuit portion 703 is a peripheral circuit portion on the source side, while that of the peripheral circuit portion 704 is a peripheral circuit portion on the gate side.

After that, thin film transistors are formed for the pixel circuit and peripheral circuit simultaneously in the same manner as in the first embodiment. According to the present embodiment, the number of driver integrated circuits (driver IC: LSI) which are required for driving a display device can be reduced by a large scale. Taking SXGA panels (1,280× 1,024) representing large size display devices (large panels) as an example, the number of driver ICs for a commercially available panel is about 14, while the number of the ICs to be used in the present invention can be reduced to at least 2 or, preferably, 0. If a liquid crystal display device is manufactured according to the present invention, the number of manufacturing processes can also be reduced due to the reduction in the number of driver ICs, thereby enabling a high quality and inexpensive display device to be provided. Such embodiment is realized because the properties of the active-matrix substrate obtained by the present embodiment satisfy the high performance required for driving the peripheral circuits.

Seventh Embodiment

A seventh embodiment enables a circuit formed from a modified silicon film to be used not only as a well-known top gate type thin film transistor circuit but also as a bottom gate type transistor circuit. If a single channel circuit consisting of only an N-channel MIS or a P-channel MIS is required, the bottom gate type is rather preferred in some cases in view of its simplified manufacturing process. Hereinafter, a mode for carrying out the present invention, which is applied to a bottom gate type thin film transistor circuit, is described with reference to FIG. 23 in this embodiment.

Figure 23:
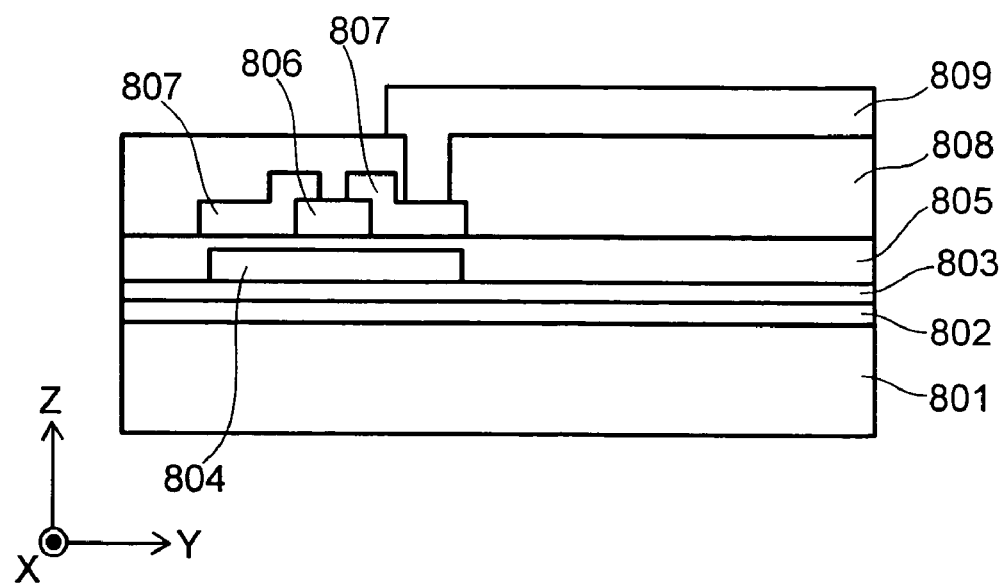
FIG. 23 is a sectional view schematically showing a configuration of a thin film transistor on an active-matrix substrate according to a seventh embodiment of the present invention.

FIG. 23 is a sectional view schematically illustrating a structure of the thin film transistor formed on an active-matrix substrate according to the present embodiment. In FIG. 23, a SiN film 802 and a SiO film 803, which function as thin barrier films, are formed on a glass substrate 801 by a CVD method or the like. On the barrier film 803, a gate electrode 804 having a predetermined shape is formed. A gate insulating film 805 is formed so as to cover the gate electrode 804. Then, an amorphous silicon film having a thickness of about 100 nm is deposited on the gate insulating film 805 by the CVD method. In the formation of the amorphous silicon film, a silane gas and a predetermined amount of phosphine may be used in combination to form an N-type MIS transistor.

After that, only the amorphous silicon film 806 is irradiated with the laser light in accordance with the above-described laser light irradiation method to modify a portion on which pixel circuits are to be formed into a polysilicon film. Then, a N+ layer having a thickness of about 20 nm is deposited on the silicon film by the CVD method wherein the amount of phosphine is increased to form a stack film. The thus-obtained stack film is subjected to dry etching so as to remain in a predetermined shape at a predetermined position, thereby obtaining an island 806. Source/drain wiring 807 is formed on the island 806, and the N+ layer exposed to a portion other than the source/drain wiring is removed by dry etching.

Next, an active-matrix substrate having the transistor circuit which is formed by using the silicon film obtained by modifying the amorphous silicon into a polysilicon film for each of pixels is manufactured by forming a passivation film 808 and a transparent electrode 809 in this order. Outlines of processing techniques relating to the formation of circuit and electrode are known to those skilled in the art. It is also known that activation annealing and so forth are required to be added to the manufacturing processes.

The cost-consuming and complicated ion implantation can be omitted since it is possible to dope an impurity carrier in the, above-described manufacturing process and, therefore, the manufacturing process is remarkably economical. A P-type MIS can also be manufactured through doping wherein borane gas is used for obtaining a P-type carrier. Therefore, the employment of the bottom gate type-transistor is an excellent method for economically providing a single channel type semiconductor device.

In the case of manufacturing the bottom gate type thin film transistor according to the present invention as in the present embodiment, metal with a high melting point may preferably be used as a gate wiring material since the silicon film is irradiated with the laser light via the insulating film on the gate wiring. Therefore, one of the characteristics of the present embodiment is the use of the gate wiring material containing tungsten (W) or molybdenum (Mo) as a main ingredient.

Eighth Embodiment

Figure 24:
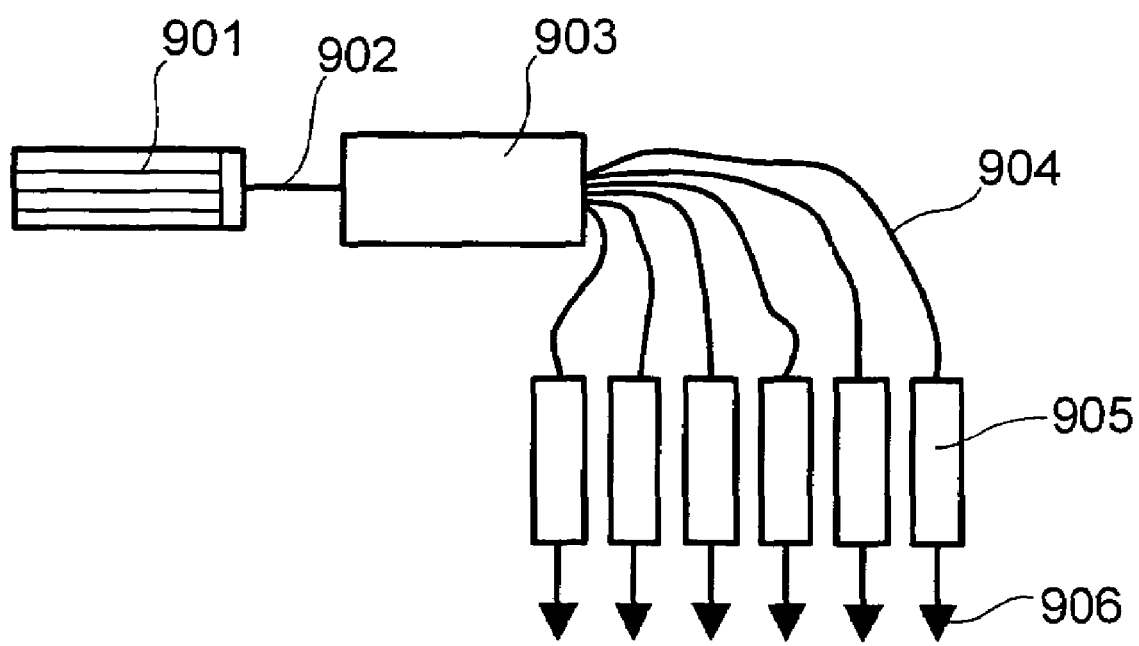
FIG. 24 is a diagram showing a configuration of improved laser irradiation equipment to be used for realizing a manufacturing method of the present invention.

FIG. 24 is a diagram illustrating an improved constructive example of laser light irradiation equipment to be used for realizing the manufacturing method of the present invention. In the present invention, a silicon film of a pixel portion is selectively irradiated with a laser beam to form pixel circuits on the thus-modified silicon film on the pixel portion. Therefore, a plurality of laser beams which are applied in parallel with one another contributes to enhancement of the productivity. The parallel application of the laser light irradiation is effectively realized by using a plurality of the laser irradiation devices which are disposed in parallel with one another as shown in FIG. 3. A method wherein a beam emitted from a single laser light source is divided into a plurality of beams, which will be described later in this specification, is also remarkably effective. In addition, with the parallel use of laser light irradiation devices, the irradiation period can be reduced to 1/m (m is the number of the devices) as compared with that achieved by a single irradiation device.

As shown in FIG. 24, the division of laser beam is performed in such a manner that a laser beam 902 emitted from a laser light source 901 is divided inside an optical system 903 such as a homogenizer. It is effective to form a plurality of irradiation beams 906 by introducing the divided laser beams into a plurality of condensation lens systems 905 using a plurality of light introducing paths such as optical fibers 904. The techniques of the beam division and formation of light introducing paths are encompassed by the optical technology; however, it should be emphasized that the use of the plurality of laser beams according to the present invention surprisingly reduces the time required for the silicon film modification. Taking the number of divided light beams as n, the irradiation period is reduced to about 1/n as compared with that achieved by a single light irradiation device. Further, if the laser beam division and the parallel use of irradiation devices are employed in combination, the irradiation period is reduced to 1/nm, thereby dramatically improving not only the productivity of the active-matrix substrate of this type but, also, the productivity of various semiconductor devices.

Figure 25:
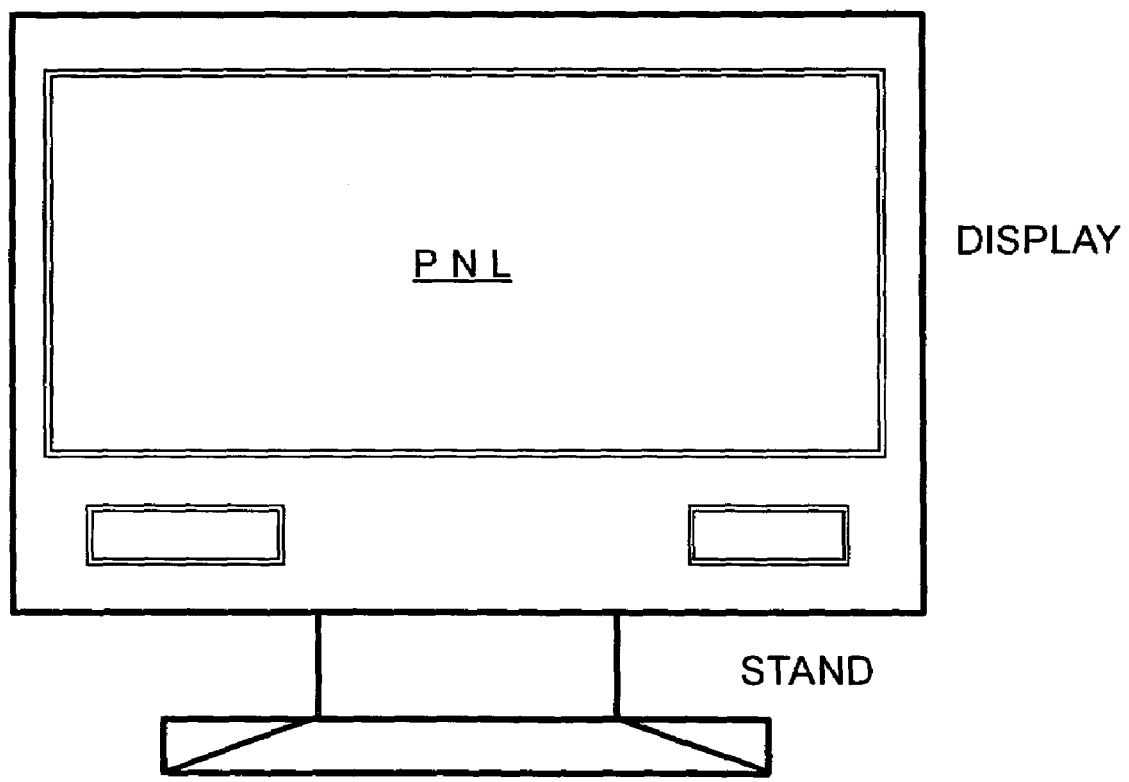
FIG. 25 is a plan view showing an appearance of an electronic device having the display device of the present invention.

FIG. 25 is a diagram showing an appearance of an electronic device using the display device of the present invention. The electronic device is a television which is provided with a panel PNL with a display having any one of the structures described in the foregoing embodiments and a stand for its upright posture. The panel PNL may be a liquid crystal display device, an organic EL display device or an active-matrix type display device of another type. In addition, the stand may be detachable.

The present invention is not limited to the structures set forth in the appended claims and the embodiments, and it is needless to say that various modifications can be made without departing from the spirit of the present invention.

As described above, the present invention provides an active-matrix substrate by selectively effectively irradiating a silicon film of a pixel portion with a laser beam to modify the silicon film and forming pixel circuits on the modified silicon film, and forms a display device using the active-matrix substrate. Therefore, the present invention enables the provision of the remarkably high performance and inexpensive display device, which enhances technical and economical effects relating to the display device by a large scale.

While we have shown and described our invention in connection with a number of example embodiments, it should be understood that the disclosed embodiments are susceptible of changes and modifications without departing from the scope of the invention. Therefore, we do not intend to be bound by the details shown and described herein but intend to cover all such changes and modifications that fall within the ambit of the appended claims.

What we claim is:

1. An active matrix display device, comprising:
a substrate; and
a plurality of pixel portions disposed in a surface of the substrate in a matrix manner along a first direction and a second direction transverse to the first direction,
wherein a first group of the plurality of pixel portions is arranged along the first direction,
wherein a second group of the plurality of pixel portions is arranged along the first direction and adjacent to the first group of the plurality of pixel portions along the second direction,
wherein a first gate wiring and a second gate wiring are extended along the first direction and are juxtaposed along the second direction in an area between the first group of the plurality of pixel portions and the second group of the plurality of pixel portions, wherein the second gate wiring is adjacent to the first gate wiring and is arranged close to the second group of the plurality of pixel portions,
wherein a plurality of data wirings each extended along the second direction are juxtaposed along the first direction and are spaced from each other by a pair of one of the pixel portions belonging to the first group and one of the pixel portions belonging to the second group adjacent to each other along the second direction,
wherein each of the first group of the plurality of pixel portions and the second group of the plurality of pixel portions is provided with a pixel electrode and an active element including a semiconductor film, a source electrode connected to one of ends of the semiconductor film and the pixel electrode, a drain electrode connected to another of the ends of the semiconductor film and one of the plurality of data wirings, a gate electrode disposed above the semiconductor film, and an interlayer insulating films disposed between the semiconductor film and the gate electrode, wherein the semiconductor film is formed of an aggregate of single crystals each extended in the first direction between the ends of the semiconductor film so as to change grain boundaries therebetween to be continuous in the first direction,
wherein the active element provided in each of the first group of the pixel portions is arranged close to the second group of the plurality of pixel portions with respect to the each of the first group of the pixel portions, and
wherein the active element provided in each of the first group of the pixel portions is arranged close to the second group of the plurality of pixel portions with respect to the each of the first group of the pixel portions, and has the gate electrode extended from the first gate wiring toward the each of the first group of the pixel portions, and
wherein the active element provided in each of the second group of the pixel portions is arranged close to the first group of the plurality of pixel portions with respect to the each of the second group of the pixel portions, and has the gate electrode extended from the second gate wiring toward the each of the second group of the pixel portions.

2. An active matrix display device according to claim 1, wherein a plurality of the first groups of the pixel portions and a plurality of the second groups of the pixel portions are arranged in the surface of the substrate to alternate respective ones of the first groups and respective ones of the second groups along the second direction, wherein each of the plurality of the second groups of the pixel portions is interposed between a pair of the first groups of the plurality of pixel portions both adjacent to the each of the second groups of the pixel portions, and wherein the active element provided in each of the pixel portions belonging to the each of the second groups is arranged close to one of the pair of the first groups of the pixel portions, and is arranged far from another of the pair of the first groups of the plurality of pixel portions.

3. An active matrix display device according to claim 1, wherein the semiconductor film disposed in the active element is formed of silicon crystals each extended in the first direction.

4. An active matrix display device according to claim 1, wherein each of the active elements is a thin film transistor configured with a pair of the source and drain electrodes each formed on the semiconductor film and the gate electrode applying a voltage to a part of the semiconductor film between the pair of the source and drain electrodes.

5. An active matrix display device according to claim 4, wherein the semiconductor film disposed in the active element is formed of silicon crystals each extended between a first portion of the semiconductor film on which one of the pair of the source and drain electrodes is formed and a second portion thereof on which another of the pair of the source and drain electrodes is formed.

6. An active matrix display device, comprising:

a substrate, a surface of which has a first end and a second end each extended in a first direction and opposite to each other in a second direction transverse to the first direction;

a first pixel row and a second pixel row, each of which is configured with a plurality of pixel portions juxtaposed in the surface of the substrate along the first direction, said first and second pixel rows being arranged adjacent to each other along the second direction transverse to the first direction in the substrate, each of said plurality of pixel portions being provided with a circuit portion having an active element;

a first signal line adapted to control the active element disposed in the circuit portion of the each pixel portions belonging to the first pixel row and a second signal line adopted to control the active element disposed in the circuit portion of the each pixel portions belonging to the second pixel row, said first signal line and said second signal line being extended along the first direction in a region between the first pixel row and the second pixel row; and the first pixel row, the first signal lines, the second signal lines, and the second pixel row being arranged in this order from the first end to the second end of the surface of the substrate in the second direction, wherein the active element includes a semiconductor film formed of an aggregate of single crystals each extended in the first direction, and grain boundaries of the single crystals are changed to be continunous in the first direction in the semiconductor film, wherein the circuit portion provided in each of the plurality of pixel portions belonging to the first pixel row is arranged close to the second end of the surface of the substrate in the each of the pixel portions belonging to the first pixel row, wherein the circuit portion provided in each of the plurality of pixel portions belonging to the second pixel row is arranged close to the first end of the surface of the substrate in the each of the pixel portions belonging to the second pixel row, and wherein the semiconductor film of the active element provided in each of the pixel portions belonging to the first pixel row is spaced from the first signal line, and the semiconductor film of the active element provided in each of the pixel portions belonging to the second pixel row is spaced from the second signal line.

7. An active matrix display device according to claim 6, wherein a plurality of the first pixel rows and a plurality of the second pixel rows are arranged alternately along the second direction in the surface of the substrate.

8. An active matrix display device according to claim 7, wherein each of the plurality of the second pixel rows is interposed between a pair of the first pixel rows both adjacent to the each of the second pixel rows.

9. An active matrix display device according to claim 6, further comprising first signal lines and second signal lines formed on the surface of the substrate, wherein each of the first signal lines controls the active element disposed in the circuit portion of the each pixel portions belonging to the each of the first pixel rows corresponding to the each first signal line, wherein each of the second signal lines controls the active element disposed in the circuit portion of the each pixel portions belonging to the each of the second pixel rows corresponding to the each second signal line, wherein each pair of one of the first signal lines and one of the second signal lines are extended along the first direction in a region between the one of the first pixel rows corresponding to the one of the first signal lines and the one of the second pixel rows corresponding to the one of the second signal lines, and wherein the one of the first pixel rows, the one of the first signal lines, the one of the second signal lines, and the one of the second pixel rows are arranged in this order from the first end to the second end of the surface of the substrate in the second direction.

10. An active matrix display device according to claim 6, wherein each of the active elements is a thin film transistor configured with a pair of electrodes each formed on the semiconductor film and a gate electrode applying a voltage to a part of the active element between the pair of electrodes.

11. An active matrix display device according to claim 10, wherein the gate electrode of the active element belonging to the first pixel row is electrically connected to a first signal line extended along the first direction, wherein the gate electrode of the active element disposed in the circuit portion provided in each of the pixel portions belonging to the second pixel row is electrically connected to a second signal line extended along the first direction, and wherein the first signal line and the second signal line are formed in a region between the pixel portions belonging to the first pixel row and the pixel portions belonging to the second pixel row in the surface of the substrate.

* * * * *